(12) United States Patent
Liu et al.

(10) Patent No.: US 11,283,911 B2
(45) Date of Patent: Mar. 22, 2022

(54) HINGE, FOLDING MECHANISM, AND TERMINAL DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xingguo Liu, Beijing (CN); Wei Qing, Beijing (CN); Fengxian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 16/966,098

(22) PCT Filed: Nov. 29, 2019

(86) PCT No.: PCT/CN2019/122042
§ 371 (c)(1),
(2) Date: Jul. 30, 2020

(87) PCT Pub. No.: WO2020/108625
PCT Pub. Date: Jun. 4, 2020

(65) Prior Publication Data
US 2021/0075898 A1    Mar. 11, 2021

(30) Foreign Application Priority Data

Nov. 30, 2018 (CN) .......................... 201811457072.3

(51) Int. Cl.
    H04M 1/02      (2006.01)
    G06F 1/16      (2006.01)
    H05K 5/02      (2006.01)

(52) U.S. Cl.
    CPC ........ *H04M 1/0268* (2013.01); *G06F 1/1616* (2013.01); *G06F 1/1652* (2013.01); *H04M 1/0216* (2013.01); *H05K 5/0226* (2013.01)

(58) Field of Classification Search
    CPC .......... E05D 3/06; E05D 11/06; E05D 3/122; E05D 3/18; G06F 1/1624; G06F 1/1626;
    (Continued)

(56) References Cited

U.S. PATENT DOCUMENTS

2010/0275412 A1   11/2010   Wang et al.
2014/0043737 A1   2/2014    Chen et al.
(Continued)

FOREIGN PATENT DOCUMENTS

CN    1897801 A      1/2007
CN    201034112 Y    3/2008
(Continued)

OTHER PUBLICATIONS

Notification to Grant Patent Right for Invention issued in Chinese Application No. 201811457072.3 dated Jun. 4, 2020, with English translation.
(Continued)

*Primary Examiner* — Nelson M Rosario
(74) *Attorney, Agent, or Firm* — McDermott Will & Emery LLP

(57) ABSTRACT

A hinge includes a rotating shaft, an inner shaft sleeve, an outer shaft sleeve, at least one first magnetic member, and at least one second magnetic member. At least one receiving hole is provided in a side face of the rotating shaft parallel to an axis of the rotating shaft. A plurality of positioning
(Continued)

holes are provided in an inner sidewall of the inner shaft sleeve. At least one placement hole is provided in an inner sidewall of the outer shaft sleeve. The outer shaft sleeve is configured to rotate relative to the inner shaft sleeve, and in a case where the first magnetic member faces a positioning hole, the first magnetic member faces the second magnetic member.

20 Claims, 10 Drawing Sheets

(58) Field of Classification Search
CPC .... G06F 1/1656; G06F 1/1681; G06F 1/1616; G06F 1/1641; G06F 1/1652; G06F 1/1683; G06F 1/1698; G06F 2203/04102; E05Y 2900/606; E05Y 2201/224; F16C 29/02; F16C 2380/00; G09F 9/301; H01Q 1/2266; H05K 1/189; H05K 5/0017; H05K 5/0226; H05K 5/03; H05K 7/1427
See application file for complete search history.

(56) References Cited

U.S. PATENT DOCUMENTS

| | | | |
|---|---|---|---|
| 2014/0376180 | A1 | 12/2014 | Chen et al. |
| 2016/0230436 | A1 | 8/2016 | Ahn |
| 2018/0324964 | A1* | 11/2018 | Yoo ..................... H05K 1/189 |
| 2018/0376603 | A1 | 12/2018 | Lee et al. |
| 2020/0150728 | A1* | 5/2020 | Escolin ................ G06F 1/1681 |

FOREIGN PATENT DOCUMENTS

| | | | |
|---|---|---|---|
| CN | 101876338 | A | 11/2010 |
| CN | 103573798 | A | 2/2014 |
| CN | 104252202 | A | 12/2014 |
| CN | 105869528 | A | 8/2016 |
| CN | 206193607 | U | 5/2017 |
| CN | 206918048 | U | 1/2018 |
| CN | 107748592 | A | 3/2018 |
| CN | 207328311 | U | 5/2018 |
| CN | 207911158 | U | 9/2018 |
| CN | 109561178 | A | 4/2019 |
| EP | 1093274 | A2 | 4/2001 |
| JP | 2006-112523 | A | 4/2006 |
| WO | 2017022926 | A1 | 2/2017 |

OTHER PUBLICATIONS

First Office Action issued in Chinese Application No. 201811457072.3 dated Jun. 2, 2020, with English Translation.
First Office Action issued in Chinese Application No. 201811457072.3 dated Feb. 6, 2020 with English Translation.

* cited by examiner

HINGE, FOLDING MECHANISM, AND TERMINAL DEVICE

CROSS-REFERENCE TO RELATED APPLICATIONS

This application is a national phase entry under 35 USC 371 of International Patent Application No. PCT/CN2019/122042 filed on Nov. 29, 2019, which claims priority to Chinese Patent Application No. 201811457072.3, filed with the Chinese Patent Office on Nov. 30, 2018, which are incorporated herein by reference in their entirety.

TECHNICAL FIELD

The present disclosure relates to the technical field of hinges, and in particular, to a hinge, a folding mechanism and a terminal device.

BACKGROUND

With the continuous development of display technologies, terminal devices such as mobile phones and tablet computers pursue large-screen visual experience while pursuing better portability. On a premise that the terminal device is convenient to carry around, in order to pursue a larger screen for display, foldable terminal devices have been developed.

With the development of flexible screen technologies, foldable flexible screens have emerged. Since the foldable flexible screen only has one screen, overall visual effect of the foldable flexible screen after unfolding is perfect.

SUMMARY

In one aspect, a hinge is provided. The hinge includes a rotating shaft, an inner shaft sleeve rotatably sleeved on an outer side of the rotating shaft, an outer shaft sleeve rotatably sleeved on an outer side of the inner shaft sleeve, at least one first magnetic member, and at least one second magnetic member. At least one receiving hole is provided in a side face of the rotating shaft parallel to an axis of the rotating shaft. A plurality of positioning holes are provided in an inner sidewall of the inner shaft sleeve, and the plurality of positioning holes are distributed and spaced apart from each other in a circumferential direction of the inner shaft sleeve. At least one placement hole is provided in an inner sidewall of the outer shaft sleeve, and at least one placement hole is distributed and spaced apart from each other in a circumferential direction of the outer shaft sleeve. Each of the at least one first magnetic member is slidably disposed in one of the at least one receiving hole. Each of at least one second magnetic member is disposed in one of at least one placement hole. The outer shaft sleeve is configured to rotate relative to the inner shaft sleeve, so that in a case where the first magnetic member 14 faces a positioning hole, the first magnetic member 14 faces the second magnetic member. The first magnetic member is configured to, in a case where the first magnetic member faces the positioning hole and the second magnetic member, slide to a first position or a second position under action of magnetic force between the first magnetic member and the second magnetic member. The first position is a position at which a part of the first magnetic member is located in the receiving hole and another part of the first magnetic member is located in the positioning hole. The second position is a position at which the first magnetic member is located in the receiving hole.

In some embodiments, the hinge further includes at least one elastic member. Each elastic member is disposed in one receiving hole. Each elastic member is connected to the first magnetic member. The elastic member is configured such that, in a case where the first magnetic member does not face the second magnetic member, the first magnetic member is located at the first position or the second position.

In some embodiments, the at least one second magnetic member includes a plurality of second magnetic members, and each second magnetic member includes a first sub-magnetic member and a second sub-magnetic member. In a radial direction of the rotating shaft, magnetic poles of ends of the plurality of first sub-magnetic members closest to the inner shaft sleeve are the same as a magnetic pole of an end of the first magnetic member closest to the outer shaft sleeve, and magnetic poles of ends of the plurality of second sub-magnetic members closest to the inner shaft sleeve are opposite to a magnetic pole of an end of the first magnetic member closest to the outer shaft sleeve. In a case where the first magnetic member faces the positioning hole, the outer shaft sleeve rotates relative to the inner shaft sleeve, so that one of the plurality of first sub-magnetic members faces the first magnetic member, and the first magnetic member is capable of sliding to the second position; or, one of the plurality of second sub-magnetic members faces the first magnetic member, and the first magnetic member is capable of sliding to the first position.

In some embodiments, in a case where the hinge further includes at least one elastic member, each elastic member is configured such that, in a case where the first magnetic member does not face the first sub-magnetic member and the second sub-magnetic member, the first magnetic member is located at the first position. In a case where the first magnetic member faces the positioning hole and the first sub-magnetic member, restoring force generated by the elastic member is overcome by magnetic force between the first magnetic member and the first sub-magnetic member, and the first magnetic member is capable of sliding to the second position.

In some embodiments, in a case where the hinge further includes at least one elastic member, each elastic member is configured such that, in a case where the first magnetic member does not face the first sub-magnetic member and the second sub-magnetic member, the first magnetic member is located at the second position. In a case where the first magnetic member faces the positioning hole and the second sub-magnetic member, restoring force generated by the elastic member is overcome by magnetic force between the first magnetic member and the second sub-magnetic member, and the first magnetic member is capable of sliding to the first position.

In some embodiments, the plurality of first sub-magnetic members and the plurality of second sub-magnetic members are alternately arranged and spaced apart from each other in the circumferential direction of the outer shaft sleeve.

In some embodiments, a magnetic pole of an end of the first magnetic member closest to the outer shaft sleeve is opposite to an magnetic pole of an end of the second magnetic member closest to the inner shaft sleeve. The elastic member is configured such that, in a case where the first magnetic member does not face the second magnetic member, the first magnetic member is located at the second position. In a case where the first magnetic member faces the positioning hole and the second magnetic member, restoring force generated by the elastic member is overcome by magnetic force between the first magnetic member and the second magnetic member, and the first magnetic member is capable of sliding to the first position.

In some embodiments, a magnetic pole of an end of the first magnetic member closest to the outer shaft sleeve is the same as a magnetic pole of an end of the second magnetic member closest to the inner shaft sleeve. The elastic member is configured such that, in a case where the first magnetic member does not face the second magnetic member, the first magnetic member is located at the first position. In a case where the first magnetic member faces the positioning hole and the second magnetic member, restoring force generated by the elastic member is overcome by magnetic force between the first magnetic member and the second magnetic member, and the first magnetic member is capable of sliding to the second position.

In some embodiments, the hinge further includes a first position-limiting portion and a second position-limiting portion. The first position-limiting portion is connected to an end of the inner shaft sleeve and is abutted against an end face of the rotating shaft. The second position-limiting portion is connected to another end of the inner shaft sleeve, and is abutted against an end face of the outer shaft sleeve.

In some embodiments, the positioning hole penetrates the inner shaft sleeve from the inner sidewall of the inner shaft sleeve to an outer sidewall of the inner shaft sleeve. Or, the positioning hole penetrates the inner shaft sleeve from the inner sidewall of the inner shaft sleeve to a certain position between the inner sidewall and the outer sidewall of the inner shaft sleeve.

In some embodiments, the whole second magnetic member or a part of the second magnetic member is disposed in the placement hole.

In some embodiments, the rotating shaft, the inner shaft sleeve and the outer shaft sleeve are all made of non-ferromagnetic materials.

In some embodiments, the at least one receiving hole and the plurality of positioning holes are located in a same plane perpendicular to the axial direction of the rotating shaft.

In some embodiments, wherein the at least one placement hole and the at least one receiving hole are located in a same plane perpendicular to the axial direction of the rotating shaft.

In some embodiments, the at least one receiving hole is evenly arranged and spaced apart from each other in a circumferential direction of the rotating shaft, the plurality of positioning holes are evenly arranged and spaced apart from each other in the circumferential direction of the inner shaft sleeve, and the at least one placement hole is evenly arranged and spaced apart from each other in the circumferential direction of the outer shaft sleeve. The number of the at least one receiving hole, the number of the plurality of positioning holes and the number of the at least one placement hole are the same; or, the number of the at least one receiving hole and the number of the plurality of positioning holes are the same, and the number of the at least one placement hole is twice the number of the at least one receiving hole. Each receiving hole is provided with one first magnetic member; and each placement hole is provided with one second magnetic member.

In another aspect, a folding mechanism is provided. The folding mechanism includes a first carrier, a second carrier and at least one hinge according to some embodiments as described above. The inner shaft sleeve of one hinge of the at least one hinge is fixedly connected to the first carrier, and the rotating shaft of the hinge is fixedly connected to the second carrier, so that the first carrier is capable of rotating relative to the second carrier around the rotating shaft of the hinge.

In some embodiments, the at least one hinge includes two hinges. The two hinges are disposed at two opposite sides of an end of the first carrier.

In some embodiments, the inner shaft sleeve of the hinge is fixedly connected to a first end of the first carrier, the rotating shaft of the hinge is connected to a first end of the second carrier. The folding mechanism further comprises: a flexible carrying portion connected to the first end of the first carrier and the first end of the second carrier, and at least one avoidance opening. Each avoidance opening is provided in a region corresponding to one hinge in the flexible carrying portion.

In yet another aspect, a terminal device is provided. The terminal device includes the folding mechanism according to some embodiments as described above.

In some embodiments, the terminal device further includes at least one display screen. The at least one display screen includes one flexible display screen; the display screen is disposed on the first carrier and the second carrier of the folding mechanism, and the display screen is capable of being folded through a relative rotation between the first carrier and the second carrier. Or, the least one display screen is disposed on the first carrier and/or the second carrier.

BRIEF DESCRIPTION OF THE DRAWINGS

In order to describe technical solutions in some embodiments of the present disclosure or the related art more clearly, accompanying drawings to be used in the description of some embodiments of the present disclosure or the related art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
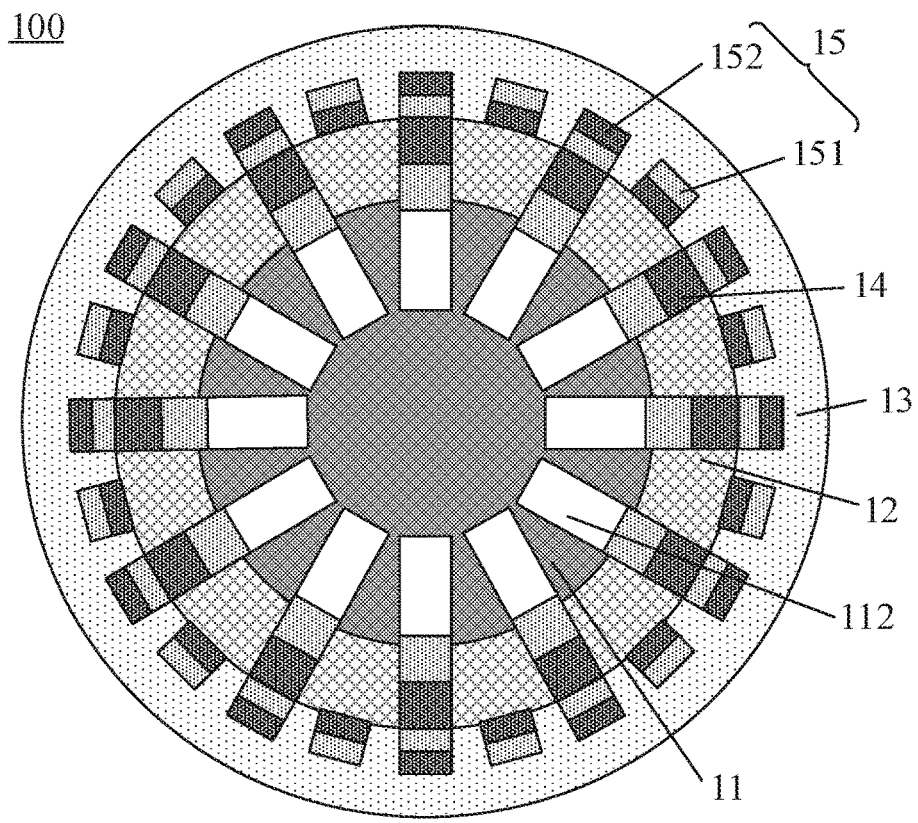
FIG. 1 is a diagram showing a state of a first magnetic member of a hinge at a first position, in accordance with some embodiments of the present disclosure.

Technical solutions in some embodiments of the present disclosure will be described clearly and completely with reference to accompanying drawings below. However, the described embodiments are merely some but not all of embodiments of the present disclosure. All other embodiments obtained by a person of ordinary skill in the art based on the embodiments provided by the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open-ended and inclusive, i.e., "included, but not limited to". In the description of the specification, terms such as "one embodiment", "some embodiments", "example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment or the example. In addition, the specific features, structures, materials or characteristics may be included in any one or more embodiments or examples in any suitable manner.

Terms such as "first" and "second" are only used for descriptive purposes, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

"At least one of A and B" has the same meaning as "A and/or B" and includes the following three combinations: only A, only B, and a combination of A and B.

At present, a terminal device with a foldable function usually implements folding of the terminal device through a folding mechanism. The folding mechanism includes two carrier portions, and one of the two carrier portions is able to rotate relative to the other. In this way, after display screen(s) are mounted on the folding mechanism, the terminal device including the display screen(s) and the folding mechanism has a foldable function.

However, in the related art, in a process in which the folding mechanism is folded or unfolded, the folding mechanism is difficult to maintain stably at a certain angle (i.e., an included angle between the two carrier portions of the folding mechanism), and thus it is difficult to meet the user's requirement for adjusting the watching angle of the screen of the terminal device.

On this basis, some embodiments of the present disclosure provide a hinge 100. Referring to FIGS. 1 to 10, the hinge 100 includes a rotating shaft 11, an inner shaft sleeve 12 rotatably sleeved on an outer side of the rotating shaft 11, an outer shaft sleeve 13 rotatably sleeved on an outer side of the inner shaft sleeve 12, at least one first magnetic member 14 (e.g., a magnet) and at least one second magnetic member 15 (e.g., a magnet). In some examples, a diameter of the rotating shaft 11 is less than or equal to an inner diameter of the inner shaft sleeve 12, and an outer diameter of the inner shaft sleeve 12 is less than or equal to an inner diameter of the outer shaft sleeve 13.

Figure 3:
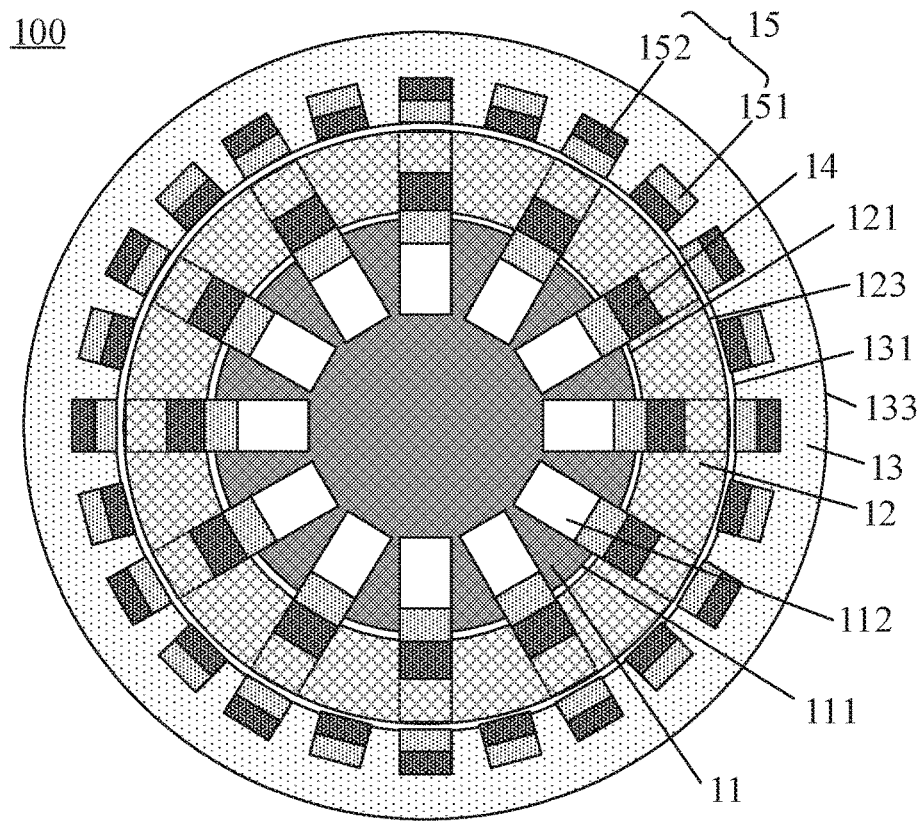
FIG. 3 is a diagram showing a state of a first magnetic member of another hinge at a first position, in accordance with some embodiments of the present disclosure.
Figure 4:
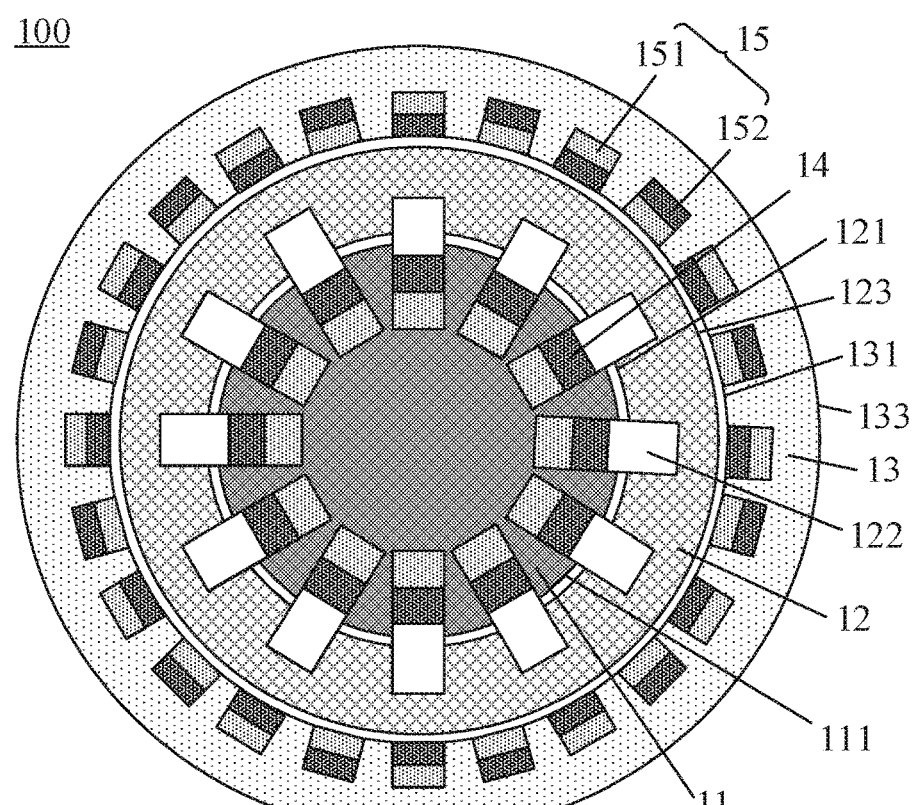
FIG. 4 is a diagram showing a state of a first magnetic member of another hinge at a second position, in accordance with some embodiments of the present disclosure.

Referring to FIGS. 3 and 4, a side face 111 of the rotating shaft 11 (i.e., a surface of the rotating shaft 11 parallel to its axis) is provided with at least one receiving hole 112. For example, the number of the receiving holes 112 is one, or more, such as two or three. The actual number of the receiving holes 112 may be selected according to actual needs, which is not limited in some embodiments of the present disclosure.

Each of the at least one first magnetic member 14 may be slidably disposed in one of the at least one receiving hole 112. For example, each of the at least one receiving hole 112 is provided with a first magnetic member 14; or, in the at least one receiving hole 112, each of some of the receiving holes 112 is provided with a first magnetic member 14. In some examples, a shape of each first magnetic member 14 matches a shape of a corresponding receiving hole 112. For example, the shape of the first magnetic member 14 is cylindrical (that is, the first magnetic member 14 is a cylindrical pin), and the shape of the receiving hole 112 corresponding to the first magnetic member 14 is also cylindrical. For another example, the shape of the first magnetic member 14 is in the shape of a cuboid, and the shape of the receiving hole 112 corresponding to the first magnetic member 14 is also in the shape of a cuboid. The shape of the first magnetic member 14 is not limited thereto, as long as the first magnetic member 14 is able to slide into the corresponding receiving hole 112. In the document, "corresponding receiving hole 112" refers to a receiving hole 112 in which the first magnetic member 14 is located.

Figure 2:
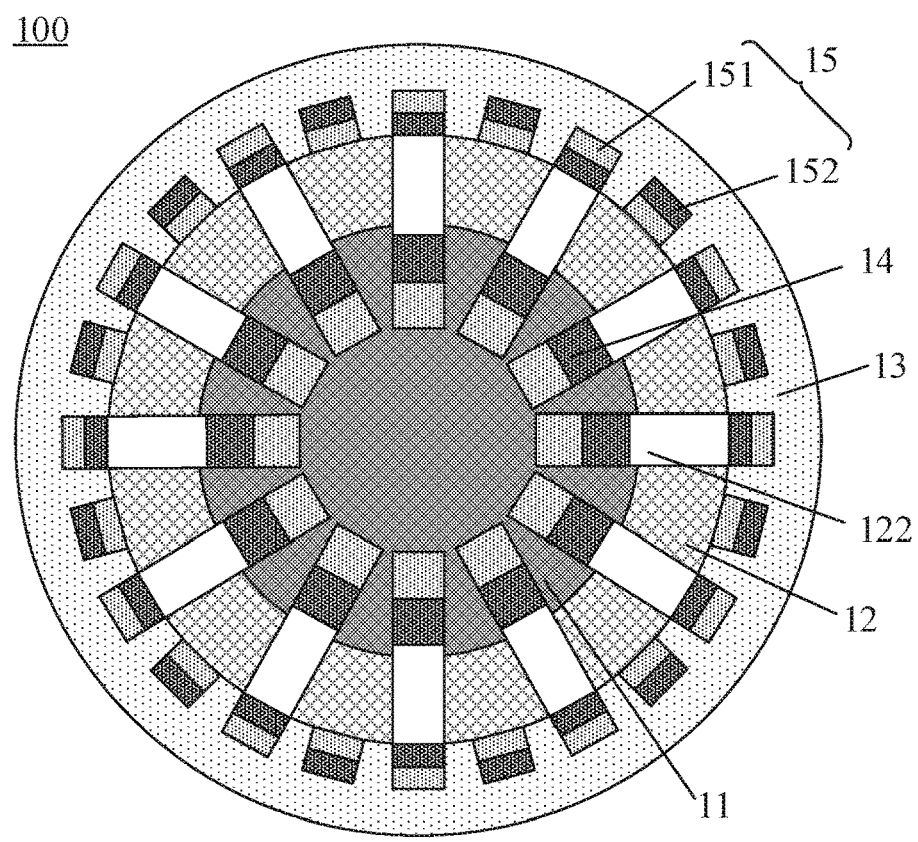
FIG. 2 is a diagram showing a state of a first magnetic member of a hinge at a second position, in accordance with some embodiments of the present disclosure.

In some examples, referring to FIG. 2, a length of each first magnetic member 14 (i.e., a dimension of the first magnetic member 14 in a depth direction of the corresponding receiving hole 112) is less than or equal to a depth of the corresponding receiving hole 112. In this way, it may be ensured that each first magnetic member 14 is completely located in the corresponding receiving hole 112, which avoid the influence on a relative rotation between the rotating shaft 11 and the inner shaft sleeve 12.

With continued reference to FIGS. 3 and 4, a plurality of positioning holes 122 are disposed in an inner sidewall 121 of the inner shaft sleeve 12, and the plurality of positioning holes 122 are distributed and spaced apart from each other in a circumferential direction of the inner shaft sleeve 12.

Each of the plurality of positioning holes 122 have a plurality of structures.

In some examples, the positioning hole 122 penetrates the inner shaft sleeve 12 from the inner sidewall 121 of the inner shaft sleeve 12 to an outer sidewall 123 of the inner shaft sleeve 12. That is, the positioning hole 122 is a through hole as shown in FIG. 2.

In some other examples, the positioning hole 122 penetrates the inner shaft sleeve 12 from the inner sidewall 121 of the inner shaft sleeve 12 to a certain position between the inner sidewall 121 and the outer sidewall 123 of the inner shaft sleeve 12. That is, the positioning hole 122 is a blind hole as shown in FIG. 4. A depth direction of the blind hole is parallel (or substantially parallel) to a radial direction of the rotating shaft 11.

Herein, the plurality of positioning holes 122 are all through holes, or are all blind holes, or a part of the positioning holes 122 are through holes and the rest of the positioning holes 122 are blind holes, which is not specifically limited herein.

In some examples, a part of the first magnetic member 14 is located in the positioning hole 122, and another part thereof is located in the receiving hole 112. In this way, a cooperation between the first magnetic member 14 and the positioning hole 122 can be used to restrict a relative rotation between the inner shaft sleeve 12 and the rotating shaft 11.

In some examples, a dimension of the first magnetic member 14 in the circumferential direction of the rotating shaft 11 matches a dimension of the positioning hole 122 in the circumferential direction of the rotating shaft 11. In this way, after the first magnetic member 14 slides into the positioning hole 122, the first magnetic member 14 may be prevented from shaking in the positioning hole 122, and the relative rotation between the inner shaft sleeve 12 and the rotating shaft 11 may be stably restricted.

In a case where there are a plurality of receiving holes 112 and a plurality of first magnetic members 14, after each first magnetic member 14 slides into the positioning hole 122, the plurality of first magnetic members 14 are able to simultaneously restrict the relative rotation between the inner shaft sleeve 12 and the rotating shaft 11. In this way, the relative rotation between the inner shaft sleeve 12 and the rotating shaft 11 may be better restricted. Moreover, each first magnetic member 14 is not prone to be damaged through shearing under action of external force, which may increase service life of the hinge 100.

Figure 7:
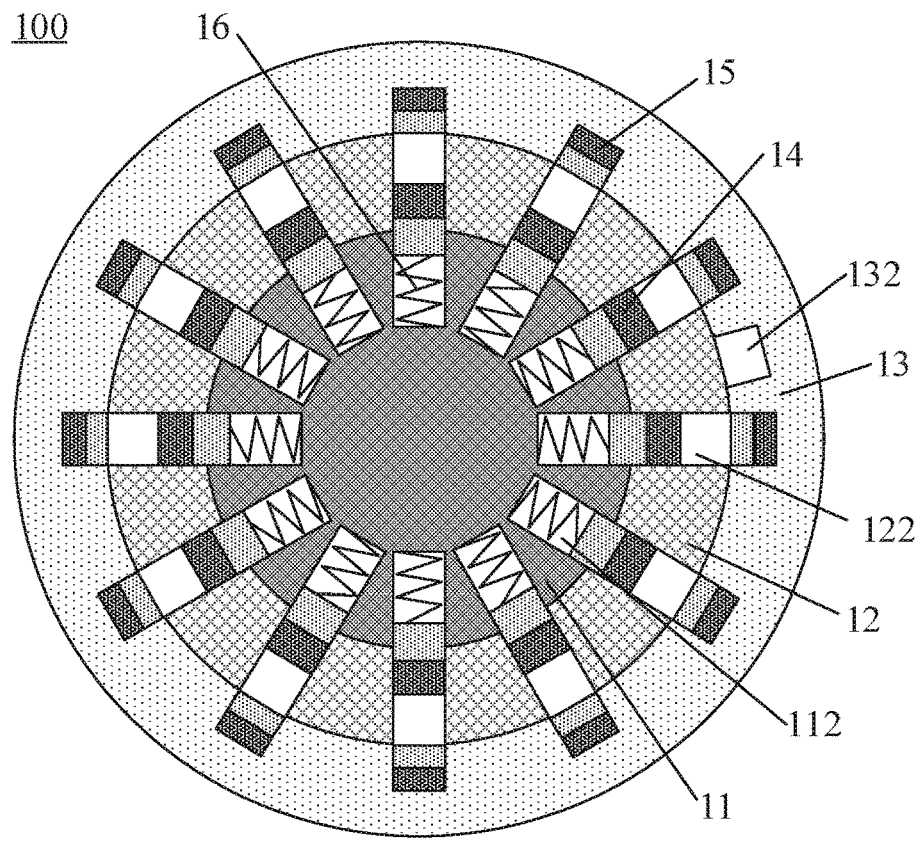
FIG. 7 is a diagram showing a state of a first magnetic member of yet another hinge at a first position, in accordance with some embodiments of the present disclosure.

Referring to FIGS. 3, 4 and 7, at least one placement hole 132 is provided in an inner sidewall 131 of the outer shaft sleeve 13. Each placement hole 15 is disposed in one placement hole 132. That is, each placement hole 132 is provided with a second magnetic member 15; or, each of some placement holes 132 is provided with a second magnetic member 15.

In some examples, the number of the placement hole 132 is one; or, the number of the placement holes 132 is more; a plurality of placement holes 132 are distributed and spaced apart from each other in a circumferential direction of the outer shaft sleeve 13. In a case where there are a plurality of placement holes 132, during rotation of the outer shaft sleeve 13, the outer shaft sleeve 13 is able to be rotated to a certain angle to realize the second magnetic member 15 and the first magnetic member 14 facing each other, so that the first magnetic member 14 slides to a first position or a second position under action of magnetic force between the second magnetic member 15 and the first magnetic member 14.

In some examples, a shape of each second magnetic member 15 matches a shape of a corresponding placement hole 132. For example, the shape of the second magnetic member 15 is cylindrical, and the shape of the corresponding placement hole 132 is also cylindrical. Or, the shape of the second magnetic member 15 is in a shape of a cuboid, and the shape of the corresponding placement hole 132 is also in a shape of a cuboid. The shape of the second magnetic member 15 is not limited thereto. Herein, the "corresponding placement hole 132" refers to a placement hole 132 in which the second magnetic member 15 is located.

Herein, the placement hole 132 has various structures.

In some examples, the placement hole 132 penetrates the outer shaft sleeve 13 from the inner sidewall 131 of the outer shaft sleeve 13 to an outer sidewall 133 of the outer shaft sleeve 13. That is, the placement hole 132 is a through hole.

In some other examples, the placement hole 132 penetrates the outer shaft sleeve 13 from the inner sidewall 131 of the outer shaft sleeve 13 to a certain position between the inner sidewall 131 and the outer sidewall 133 of the outer shaft sleeve 13. That is, the placement hole 132 is a blind hole as shown in FIGS. 3, 4 and 7. A depth direction of the blind hole is parallel (or substantially parallel) to a radial direction of the outer shaft sleeve 13.

Herein, the plurality of placement holes 132 are all through holes, or all blind holes, or a part of the placement holes 132 are through holes and the rest of the placement holes 132 are blind holes, which is not specifically limited herein.

In some examples, the whole second magnetic member or a part of the second magnetic member 15 is disposed in the corresponding placement hole 132. Herein, a part of the second magnetic member 15 refers to most of the second magnetic member 15. That is, in a case where a part of the second magnetic member 15 is disposed in the corresponding placement hole 132, most of the second magnetic member 15 (or almost the whole second magnetic member) is disposed in the corresponding placement hole 132. In this way, a relative rotation between the inner shaft sleeve 12 and the outer shaft sleeve 13 may be prevented from being affected.

In some examples, each second magnetic member 15 is fixedly disposed in the corresponding placement hole 132. For example, each second magnetic member 15 is disposed in the corresponding placement hole 132 in a non-detachable fixing connection manner, such as, a bonding connection; or, each second magnetic member 15 is disposed in the corresponding placement hole 132 in a detachable fixing connection manner, such as, a threaded connection, a pin connection, or an elastic deformation connection.

The outer shaft sleeve 13 is configured to rotate relative to the inner shaft sleeve 12, so as to make the first magnetic member 14 face the second magnetic member 15 in a case where the first magnetic member 14 faces the positioning hole 122.

Since the second magnetic member 15 is disposed in the placement hole 132 in the outer shaft sleeve 13, during rotation of the outer shaft sleeve 13 relative to the inner shaft sleeve 12, the second magnetic member 15 rotates relative to the inner shaft sleeve 12 with the rotation of the outer shaft sleeve 13. In a case where the first magnetic member 14 faces the corresponding positioning hole 122, the first magnetic member 14 will face the second magnetic member 15 with the rotation of the outer shaft sleeve 13 relative to the inner shaft sleeve 12.

The first magnetic member 14 is configured to, in a case where the first magnetic member 14 faces the positioning hole 122 and the second magnetic member 15, slide to the first position or the second position under action of the magnetic force (gravitation or repulsion) between the first magnetic member 14 and the second magnetic member 15.

Referring to FIG. 1, the first position is a position where a part of the first magnetic member 14 is located in the receiving hole 112, and another part of the first magnetic member 14 is located in the positioning hole 122. Referring to FIG. 2, the second position is a position where the first magnetic member 14 is located in the receiving hole 112.

Since the first magnetic member 14 may slide into the corresponding receiving hole 112, and the second magnetic member 15 is fixedly disposed in the corresponding placement hole 132, in a case where the first magnetic member 14 faces the positioning hole 122 and the second magnetic member 15, if the magnetic force between the first magnetic member 14 and the second magnetic member 15 is gravitation, the first magnetic member 14 will slide to the first position under action of the gravitation; if the magnetic force between the first magnetic member 14 and the second magnetic member 15 is repulsion, the first magnetic member 14 will slide to the second position under action of the repulsion.

Hereinafter, some embodiments of the present disclosure take a certain first magnetic member 14 in FIG. 1 as an example to schematically illustrate the working process of the hinge 100, and the movement process of other first magnetic members 14 may refer to the first magnetic member 14. Referring to FIGS. 1 and 2, the working process of the hinge 100 is as follows.

In a certain state, the first magnetic member 14 faces a certain positioning hole 122, and is located at the first position. The outer shaft sleeve 13 rotates relative to the inner shaft sleeve 12, so that a certain second magnetic member 15 faces the positioning hole 122. In this case, repulsion is generated between the first magnetic member 14 and the second magnetic member 15 (that is, a magnetic pole of an end of the first magnetic member 14 closest to the outer shaft sleeve 13 is the same as a magnetic pole of an end of the second magnetic member 15 closest to the inner shaft sleeve 12). The first magnetic member 14 slides to the second position under the action of the repulsion, that is, the first magnetic member 14 is located in the corresponding receiving hole 112. The inner shaft sleeve 12 may rotate relative to the rotating shaft 11.

Then, the inner shaft sleeve 12 rotates relative to the rotating shaft 11, for example, the inner shaft sleeve 12 is rotated by 30 degrees, 60 degrees or 90 degrees, so that the first magnetic member 14 faces another positioning hole 122. Then, the outer shaft sleeve 13 rotates relative to the inner shaft sleeve 12, so that another second magnetic member 15 faces the positioning hole 122. In this case, gravitation is generated between the first magnetic member 14 and the second magnetic member 15 (that is, the magnetic pole of the end of the first magnetic member 14 closest to the outer shaft sleeve 13 is opposite to the magnetic pole of the end of the second magnetic member 15 closest to the inner shaft sleeve 12). The first magnetic member 14 slides to the first position under the action of the gravitation, that is, a part of the first magnetic member 14 is located in the positioning hole 122, and another part thereof is located in the receiving hole 112. The relative rotation between the rotating shaft 11 and the inner shaft sleeve 12 is restricted through the cooperation among the first magnetic member 14, the receiving hole 112 and the positioning hole 122.

Therefore, in the hinge 100 provided by the embodiments of the present disclosure, at least one first magnetic member 14 is disposed in the receiving hole 112 in the rotating shaft 11, a plurality of positioning holes 122 are disposed and spaced apart from each other in the circumferential direction of the inner shaft sleeve 12 in the inner sidewall 121 of the inner shaft sleeve 12, and at least one placement hole 15 is disposed in the placement hole 132 in the outer shaft sleeve 13 and spaced apart from each other in the circumferential direction of the outer shaft sleeve 13. In this way, the first magnetic member 14 may face different positioning holes 122 through the cooperation between the inner shaft sleeve 12 and the outer shaft sleeve 13. That is, the first magnetic member 14 may slide into different positioning holes 122, so that the inner shaft sleeve 12 may be fixed at different positions relative to the rotating shaft 11.

In a case where the hinge 100 is applied to a folding mechanism (or furthermore, the folding mechanism is applied to a foldable terminal device), a part of the folding mechanism may be connected to the rotating shaft 11, and another part of the folding mechanism may be connected to the inner shaft sleeve 12. In this case, the another part of the folding mechanism may rotate relative to the part of the folding mechanism as the rotating shaft 11 rotates relative to the inner shaft sleeve 12, and a foldable function of the folding mechanism is realized. On this basis, the first magnetic member 14 is located at the first position through a mutual cooperation among the rotating shaft 11, the first magnetic member 14, the inner shaft sleeve 12, the outer shaft sleeve 13, and the second magnetic member 15. That is, the first magnetic member 14 is inserted into a certain positioning hole of the inner shaft sleeve 12. In this way, it can be ensured that an included angle between the two parts of the folding mechanism may be stably maintained at a certain angle. Herein, the certain angle is, for example, an angle corresponding to the fully unfolded folding mechanism (that is, the angle between the two parts of the folding mechanism is 180 degree), an angle corresponding to the fully folded folding mechanism (that is, the angle between the two parts of the folding mechanism is 0 degree), or a certain angle between the angle corresponding to the fully unfolded folding mechanism and the angle corresponding to the fully folded folding mechanism.

Moreover, the first magnetic member 14 slides into different positioning holes 122, so that the included angle between the two parts of the folding mechanism may be changed. In this way, the need for adjusting the fixed angle of the folding mechanism may be met, thereby meeting the user's requirement for adjusting the watching angle of the screen of the foldable terminal device.

In addition, in the hinge 100 provided by the embodiments of the present disclosure, the position of the first magnetic member 14 is controlled by the magnetic force generated between the first magnetic member 14 and the second magnetic member 15, so that the rotating shaft 11 and the inner shaft sleeve 12 may be maintained at a certain position. In this way, the wear between the rotating shaft 11 and the inner shaft sleeve 12 may be avoided, and the service life of the hinge 100 may be improved. Moreover, structures of the rotating shaft 11, the inner shaft sleeve 12, the outer shaft sleeve 13, the first magnetic member 14 and the second magnetic member 15 are simple, and they are easy to manufacture, which is conducive to reducing the cost of manufacturing and maintaining the hinge 100.

In some embodiments, the rotating shaft 11, the inner shaft sleeve 12, and the outer shaft sleeve 13 are all made of non-ferromagnetic materials. Since the non-ferromagnetic material cannot be magnetized, the non-ferromagnetic material is used to form the rotating shaft 11, the inner shaft sleeve 12 and the outer shaft sleeve 13 to prevent the rotating shaft 11, the inner shaft sleeve 12 and the outer shaft sleeve 13 from affecting the magnetic force between the first magnetic member 14 and the second magnetic member 15. Therefore, it is ensured that the first magnetic member 14 is able to slide to the first position or the second position under the action of the magnetic force therebetween, so as to realize the relative fixation or rotation between the rotating shaft 11 and the inner shaft sleeve 12. For example, the non-ferromagnetic material is plastic, or other organic or inorganic materials, which is not specifically limited herein.

Figure 11:
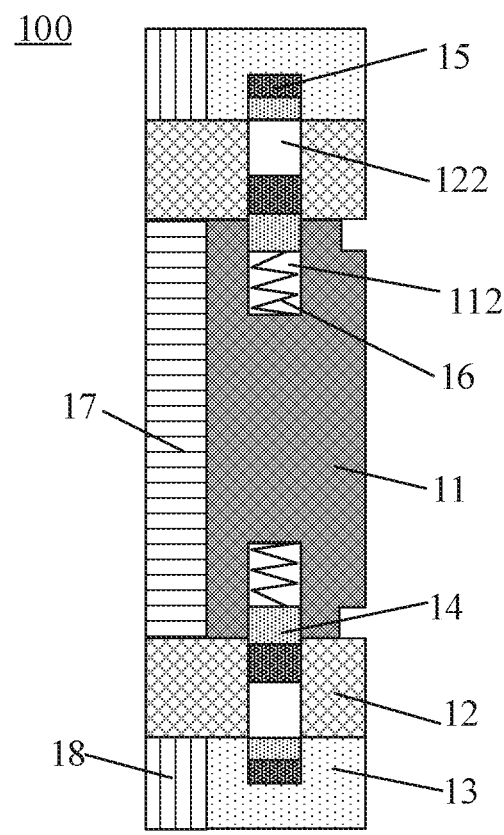
FIG. 11 is a structural diagram of a hinge, in accordance with some embodiments of the present disclosure.

In some embodiments, referring to FIG. 11, the positioning holes 122 and the receiving holes 112 are located in a same plane perpendicular to the axial direction of the rotating shaft 11. In this way, during rotation of the inner shaft sleeve 12 relative to the rotating shaft 11, it can be ensured that the first magnetic member 14 in the receiving hole 112 may slide into the positioning hole 122, and it may avoid affecting the restriction of the relative rotation between the inner shaft sleeve 12 and the rotating shaft 11.

In some examples, the arrangement manner of the positioning holes 122 and the receiving holes 112 being located in a same plane perpendicular to the axial direction of the rotating shaft 11 may be various. For example, axes of the positioning holes 122 and axes of the receiving holes 112 are located in the same plane perpendicular to the axial direction of the rotating shaft 11 (as shown in FIG. 11).

Other arrangement manners of the receiving holes 112 and the positioning holes 122 may be selected according to actual needs, which is not limited in the embodiments of the present disclosure. For example, an area of the positioning hole 122 is greater than an area of the receiving hole 112, and the axes of the positioning holes 122 and the axes of the receiving holes 112 are not in the same plane perpendicular to the axial direction of the rotating shaft 11. For another example, referring to FIG. 14, some of the plurality of receiving holes 112 are located in a first plane perpendicular to the axis direction of the rotating shaft 11, and some of the plurality of receiving holes 112 are located in a second plane perpendicular to the axis direction of the rotating shaft 11. The first plane is parallel to the second plane. Some of the plurality of positioning holes 122 are located in the first plane, and some of the plurality of positioning holes 122 are located in the second plane.

In some embodiments, referring to FIG. 11, the placement holes 132 and the receiving holes 112 are located in the same plane perpendicular to the axis direction of the rotating shaft 11. In this way, during the rotation of the outer shaft sleeve 13, and in a case where the second magnetic member 15 faces the first magnetic member 14, a distance between the second magnetic member 15 and the first magnetic member 14 is small. Therefore, the magnetic force generated between the second magnetic member 15 and the first magnetic member 14 is large, and the first magnetic member 14 may be smoothly switched between the first position and the second position.

In some examples, the arrangement manner in which the placement holes 132 and the receiving holes 112 are located in the same plane perpendicular to the axial direction of the rotating shaft 11 may be various. For example, axes of the placement holes 132 and axes of the receiving holes 112 are located in the same plane perpendicular to the axial direction of the rotating shaft 11 (as shown in FIG. 11).

Other arrangement manners of the placement holes 132 and the receiving holes 112 may be selected according to actual needs, which is not limited in the embodiments of the present disclosure. For example, an area of the placement hole 132 is greater than the area of the receiving hole 112, and the axes of the placement holes 132 and the axes of the receiving holes 112 are not in the same plane perpendicular to the axial direction of the rotating shaft 11. For another example, referring to FIG. 14, some of the plurality of placement holes 132 are located in the first plane perpendicular to the axis direction of the rotating shaft 11, and some of the plurality of placement holes 132 are located in the second plane perpendicular to the axis direction of the rotating shaft 11. The first plane is parallel to the second plane. Some of the plurality of receiving holes 112 are located in the first plane, and some of the plurality of receiving holes are located in the second plane.

In some embodiments, referring to FIGS. 5 to 10, the hinge 100 provided by some embodiments of the present disclosure further includes elastic member(s) 16 disposed in the receiving hole(s) 112. The elastic members 16 are connected to the first magnetic members 14 in one-to-one correspondence. That is, each elastic member 16 is correspondingly connected to one first magnetic member 14. An arrangement manner of the elastic member 16, for example, is that one end of the elastic member 16 is connected to the receiving hole 112, and another end thereof is connected to an end of the first magnetic member 14 facing away from the outer shaft sleeve 13.

The elastic member 16 is configured such that, in a case where the first magnetic member 14 does not face the second magnetic member 15, the first magnetic member 14 is located at the first position or the second position. Herein, the case where the first magnetic member 14 does not face the second magnetic member 15 means that the first magnetic member 14 is not affected by the magnetic force (e.g., gravitation or repulsion) generated between the first magnetic member 14 and the second magnetic member 15. In this case, the elastic member 16 is not subjected to pressure or tension from the first magnetic member 14.

The elastic member 16 has various structures, for example, it is a spring or an elastic sheet. In a depth direction of the receiving hole 112, the elastic member 16 has a certain dimension without receiving pressure or tension from the first magnetic member 14. In a case where the elastic member 16 is compressed (or elongated) through the pressure (or the tension) from the first magnetic member 14, it will generate a restoring force to restore the dimension of the elastic member 16 to a dimension where it is not subjected to the pressure (or the tension) from the first magnetic member 14.

In some examples, the elastic member 16 is made of a non-ferromagnetic material, which may prevent the magnetic force between the first magnetic member 14 and the second magnetic member 15 from affecting the compressing or elongating of the elastic member 16.

In the case where the first magnetic member 14 does not face the second magnetic member 15, that is, the elastic member 16 is not subjected to the repulsion or the gravitation, the first magnetic member 14 may be maintained at the first position or the second position through the elastic member 16. It is avoided that, in the case where the first magnetic member 14 does not face the second magnetic member 15, the first magnetic member 14 slides from the first position to the second position or from the second position to the first position. Moreover, it is also possible to avoid the noise generated by the first magnetic member 14 sliding from the first position to the second position or from the second position to the first position.

In some embodiments, the hinge 100 provided by some embodiments of the present disclosure includes a plurality of receiving holes 112, a plurality of positioning holes 122, a plurality of placement holes 132, a plurality of first magnetic members 14 and a plurality of second magnetic members 15. The plurality of receiving holes 112 corresponds to the plurality of first magnetic members 14 in one-to-one correspondence. That is, each receiving hole is provided with a first magnetic member 14. The plurality of receiving holes 112 corresponds to the plurality of positioning holes 122 in one-to-one correspondence. That is, in a case where the plurality of receiving holes 112 face the plurality of positioning holes 122, each receiving hole 112 faces one positioning hole 122. The situation described in the foregoing embodiments is used as an example below to schematically illustrate a manner in which the first magnetic member 14 slides to the first position or the second position by utilizing the second magnetic member 15.

The manner in which the first magnetic member 14 slides to the first position or the second position by utilizing the second magnetic member 15 is various. For example, the first magnetic member 14 slides to the first position or the second position under the direct action of the magnetic force between the second magnetic member 15 and the first magnetic member 14. Or, the first magnetic member 14 slides to the first position or the second position through a cooperation between the magnetic force between the second magnetic member 15 and the first magnetic member 14 and the restoring force generated by the elastic member 16.

In some embodiments, the first magnetic member 14 slides to the first position or the second position under the direct action of the magnetic force between the second magnetic member 15 and the first magnetic member 14.

In some examples, referring to FIGS. 1 and 2, the second magnetic member 15 includes a first sub-magnetic member 151 and a second sub-magnetic member 152. In this case, the number of the receiving holes 112 is the same as the number of the positioning holes 122, and the number of the placement holes 132 is twice the number of the receiving holes 112. Some of the placement hole 132 are provided with the first sub-magnetic members 151, and others are provided with the second sub-magnetic members 152.

For example, an arrangement manner of the first sub-magnetic members 151 and the second sub-magnetic members 152, for example, is that the first sub-magnetic members 151 and the second sub-magnetic members 152 are alternately arranged and spaced apart from each other in the circumferential direction of the outer shaft sleeve 13. In this way, during the rotation of the outer shaft sleeve 13 relative to the inner shaft sleeve 12, the outer shaft sleeve 13 only needs to rotate a small angle each time to make the first sub-magnetic member 151 face the first magnetic member 14, or make the second sub-magnetic member 152 face the first magnetic member 14.

In a radial direction of the rotating shaft, a magnetic pole of an end of the first sub-magnetic member 151 closest to the inner shaft sleeve 12 is the same as the magnetic pole of the end of the first magnetic member 14 closest to the outer shaft sleeve 13. A magnetic pole of an end of the second sub-magnetic member 152 closest to the inner shaft sleeve 12 is opposite to the magnetic pole of the end of the first magnetic member 14 closest to the outer shaft sleeve 13.

For example, the magnetic pole of the end of the first magnetic member 14 closest to the outer shaft sleeve 13 is N-pole, and the magnetic pole of the end of the first sub-magnetic member 151 closest to the inner shaft sleeve 12 is N-pole, and the magnetic pole of the end of the second sub-magnetic member 152 closest to the inner shaft sleeve 12 is S-pole. Or, the magnetic pole of the end of the first magnetic member 14 closest to the outer shaft sleeve 13 is S-pole, and the magnetic pole of the end of the first sub-magnetic member 151 closest to the inner shaft sleeve 12 is S-pole, and the magnetic pole of the end of the second sub-magnetic member 152 closest to the inner shaft sleeve 12 is N-pole.

In the case where the first magnetic member 14 faces the positioning hole 122, the outer shaft sleeve 13 rotates relative to the inner shaft sleeve 12, so that the first sub-magnetic member 151 faces the first magnetic member 14, and the first magnetic member 14 is able to slide to the second position; or, the second sub-magnetic member 152 faces the first magnetic member 14, and the first magnetic member 14 is able to slide to the first position.

The arrangement manner of the first sub-magnetic members 151 and the second sub-magnetic members 152, for example, is that the first sub-magnetic members 151 and the second sub-magnetic members 152 are alternately arranged and spaced apart from each other in the circumferential direction of the outer shaft sleeve 13. In this way, during the rotation of the outer shaft sleeve 13 relative to the inner shaft sleeve 12, the outer shaft sleeve 13 only needs to rotate a small angle each time to make the first sub-magnetic member 151 face the first magnetic member 14, or make the second sub-magnetic member 152 face the first magnetic member 14.

Herein, a process in which the first magnetic member 14 slides to the second position or the first position under an action of the first sub-magnetic member 151 and the first magnetic member 14 or an action of the second sub-magnetic member 152 and the first magnetic member 14 is as follows.

With continued reference to FIGS. 1 and 2, during the rotation of the inner shaft sleeve 12 relative to the rotating shaft 11, and in a case where the first magnetic member 14 in the receiving hole 112 in the rotating shaft 11 faces the positioning hole 122 in the inner shaft sleeve 12, the outer shaft sleeve 13 rotates to a certain position, for example, a position at which the second sub-magnetic member 152 faces the positioning hole 122. The second sub-magnetic member 152 is fixedly disposed in the placement hole 132, and the magnetic pole of the end of the first magnetic member 14 closest to the outer shaft sleeve 13 is opposite to the magnetic pole of the end of the second sub-magnetic member 152 closest to the inner shaft sleeve 12. Therefore, gravitation generated between the second sub-magnetic member 152 and the first magnetic member 14 causes the first magnetic member 14 to move to the first position. In this case, the inner shaft sleeve 12 and the rotating shaft 11 are retained by the first magnetic member 14, so that the two cannot rotate relatively. In this way, the folding mechanism having the hinge 100 may maintain an angle corresponding to the fully unfolded state of the folding mechanism, or an angle corresponding to the fully folded state of the folding mechanism, or a certain angle between the angle corresponding to the fully unfolded state of the folding mechanism and the angle corresponding to the fully folded state of the folding mechanism.

Then, the outer shaft sleeve 13 rotates to another position, for example, a position at which the first sub-magnetic member 151 faces the positioning hole 122. The first sub-magnetic member 151 is fixedly disposed in the placement hole 132, and the magnetic pole of the end of the first magnetic member 14 closest to the outer shaft sleeve 13 is the same as the magnetic pole of the end of the first sub-magnetic member 151 closest to the inner shaft sleeve 12. Therefore, repulsion generated between the the first sub-magnetic member 152 and the first magnetic member 14 causes the first magnetic member 14 to move to the second position. In this case, a relative rotation may occur between the inner shaft sleeve 12 and the rotating shaft 11, so that the angle of the folding mechanism having the hinge 100 may be changed.

In some other embodiments, the first magnetic member 14 may slide to the first position or the second position through the cooperation between the magnetic force between the second magnetic member 15 and the first magnetic member 14 and the restoring force generated by the elastic member 16.

Figure 5:
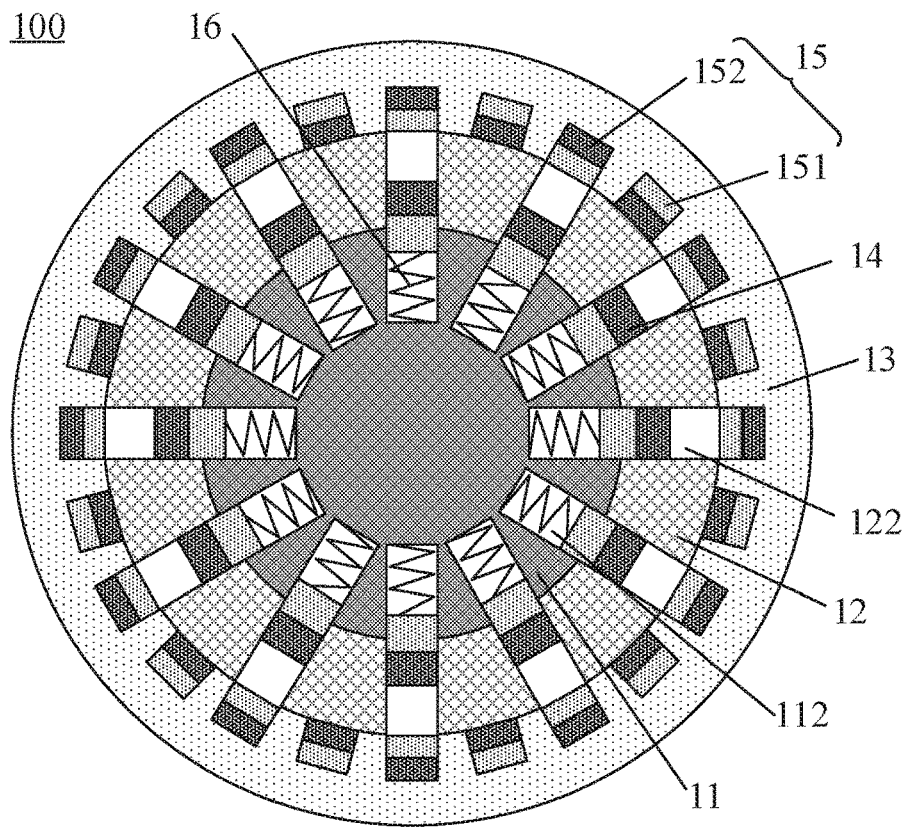
FIG. 5 is a diagram showing a state of a first magnetic member of yet another hinge at a first position, in accordance with some embodiments of the present disclosure.
Figure 6:
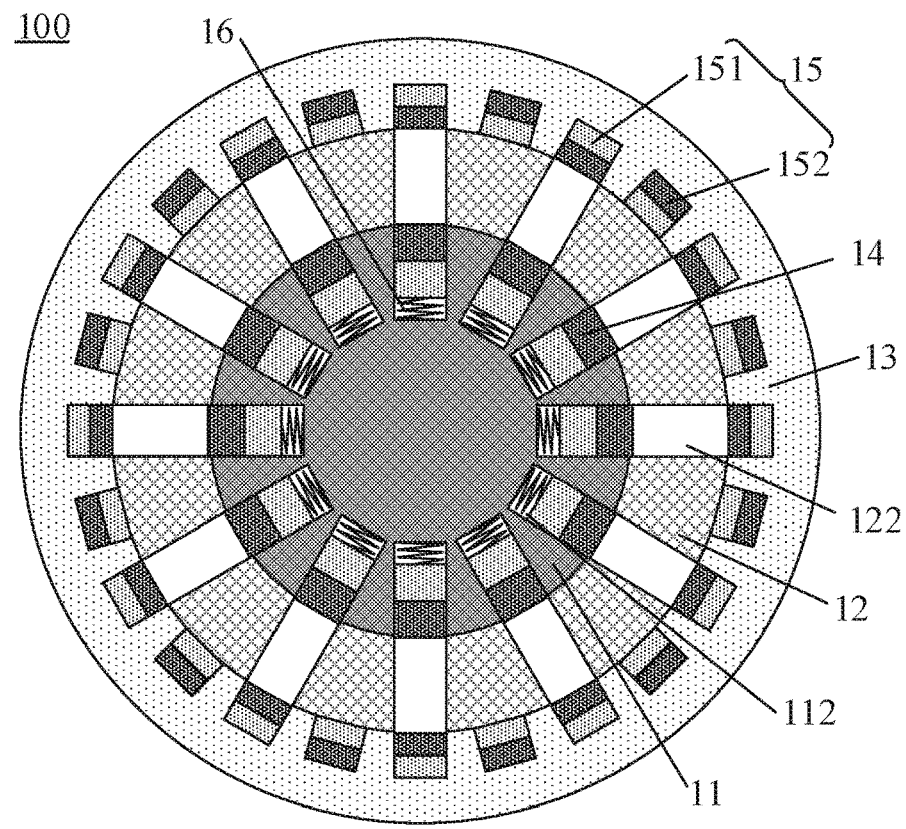
FIG. 6 is a diagram showing a state of a first magnetic member of yet another hinge at a second position, in accordance with some embodiments of the present disclosure.

In some examples, referring to FIGS. 5 and 6, on a basis that the second magnetic member 15 includes the first sub-magnetic member 151 and the second sub-magnetic member 152, the hinge 100 further includes elastic member(s) 16.

Herein, since the elastic member 16 can be elastically deformed, two restoring forces in two opposite directions are generated. There are many ways to make the first magnetic member 14 slide to the first position or the second position by using the cooperation among the second magnetic member 15, the first magnetic member 14 and the elastic member 16.

For example, the elastic member 16 is configured such that, in a case where the first magnetic member 14 does not face the first sub-magnetic member 151 and the second sub-magnetic member 152, the first magnetic member 14 is located at the first position. The elastic member 16 is further configured such that, in a case where the first magnetic member 14 faces the positioning hole 122 and the first sub-magnetic member 151, the restoring force generated by the elastic member 16 (a direction of the restoring force is directed from the first magnetic member 14 to the first sub-magnetic member 151) is overcome by the magnetic force (i.e., repulsion) between the first magnetic member 14 and the first sub-magnetic member 151, so that the first magnetic member 14 slides to the second position.

Herein, the process in which the first magnetic member 14 is caused to slide to the second position or the first position through a cooperation among the first sub-magnetic member 151, the first magnetic member 14 and the elastic member 16, or a cooperation among the second sub-magnetic member 152, the first magnetic member 14 and the elastic member 16 is as follows.

With continued reference to FIGS. 5 and 6, during the rotation of the inner shaft sleeve 12 relative to the rotating shaft 11, the first magnetic member 14 in the receiving hole 112 in the rotating shaft 11 faces the positioning hole 122 in the inner shaft sleeve 12, and does not face the first sub-magnetic 151 and the second sub-magnetic 152. In this case, the elastic member 16 is not elastically deformed, and the first magnetic member 14 is located at the first position under support of the elastic member 16.

The outer shaft sleeve 13 rotates to a certain position, for example, a position at which the second sub-magnetic member faces the positioning hole 122. Under action of the gravitation generated between the first magnetic member 14 and the second sub-magnetic member 152, the first magnetic member 14 will further slide toward the second sub-magnetic member 152 to ensure that the first magnetic member 14 is located at the first position. In this case, the inner shaft sleeve 12 and the rotating shaft 11 are retained by the first magnetic member 14, so that the two cannot rotate relatively. In this way, the folding mechanism having the hinge 100 may maintain the angle corresponding to the fully folded state of the folding mechanism, or the angle corresponding to the fully unfolded state of the folding mechanism, or a certain angle between the angle corresponding to the fully folded state of the folding mechanism and the angle corresponding to the fully unfolded state of the folding mechanism.

Then, the outer shaft sleeve 13 rotates to another position, for example, a position at which the first sub-magnetic member 151 faces the positioning hole 122. The repulsion generated between the first sub-magnetic member 151 and the first magnetic member 14 is able to make the first magnetic member 14 slide to the second position, and the repulsion can overcome the restoring force generated by the elastic deformation (compression) of the elastic member 16, and keep the first magnetic member 14 at the second position. In this case, a relative rotation may occur between the inner shaft sleeve 12 and the rotating shaft 11, so that the angle of the folding mechanism having the hinge 100 may be changed.

For example, the elastic member 16 is configured such that, in the case where the first magnetic member 14 does not face the first sub-magnetic member 151 and the second sub-magnetic member 152, the first magnetic member 14 is located at the second position; and in a case where the first magnetic member 14 faces the positioning hole 122 and the second sub-magnetic member 152, the restoring force generated by the elastic member 16 (a direction of the restoring force is directed from the second sub-magnetic member 152 to the first magnetic member 14) is overcome by the magnetic force (i.e., gravitation) between the first magnetic member 14 and the second sub-magnetic member 152, so that the first magnetic member 14 is able to slide to the first position.

Herein, the process in which the first magnetic member 14 is caused to slide to the first position or the second position through a cooperation among the first sub-magnetic member 151, the first magnetic member 14 and the elastic member 16, or a cooperation among the second sub-magnetic member 152, the first magnetic member 14 and the elastic member 16 is as follows.

During rotation of the inner shaft sleeve 12 relative to the rotating shaft 11, the first magnetic member 14 in the receiving hole 112 in the rotating shaft 11 faces the positioning hole 122 in the inner shaft sleeve 12, and does not face the first sub-magnetic 151 and the second sub-magnetic 152. In this case, the elastic member 16 is not elastically deformed, and the first magnetic member 14 is located at the second position under support of the elastic member 16.

The outer shaft sleeve 13 rotates to a certain position, for example, a position at which the second sub-magnetic member 152 faces the positioning hole 122. The gravitation generated between the second sub-magnetic member 152 and the first magnetic member 14 is able to make the first magnetic member 14 slide to the first position, and the gravitation can overcome the restoring force generated by the elastic deformation (elongation) of the elastic member 16 and keep the first magnetic member 14 at the first position. In this case, the inner shaft sleeve 12 and the rotating shaft 11 are retained by the first magnetic member 14, so that the two cannot rotate relatively. In this way, the folding mechanism having the hinge 100 may maintain the angle corresponding to the fully folded state of the folding mechanism, or the angle corresponding to the fully unfolded state of the folding mechanism, or a certain angle between the angle corresponding to the fully folded state of the folding mechanism and the angle corresponding to the fully unfolded state of the folding mechanism.

Then, the outer shaft sleeve 13 rotates to another position, for example, a position at which the first sub-magnetic member 151 faces the positioning hole 122. The first magnetic member 14 is able to slide to the second position under a combined action of the repulsion generated between the first sub-magnetic member 151 and the first magnetic member 14 and the restoring force generated by the elastic member 16. In this case, a relative rotation may occur between the inner shaft sleeve 12 and the rotating shaft 11, so that the angle of the folding mechanism having the hinge 100 may be changed.

In some other examples, the second magnetic member 15 does not include the first sub-magnetic member 151 and the second sub-magnetic member 152. The hinge 100 further includes elastic member(s) 16. The number of the receiving holes 112, the number of positioning holes 122, and the number of placement holes 132 are the same. Each placement hole 132 is provided with one second magnetic member 15.

Figure 8:
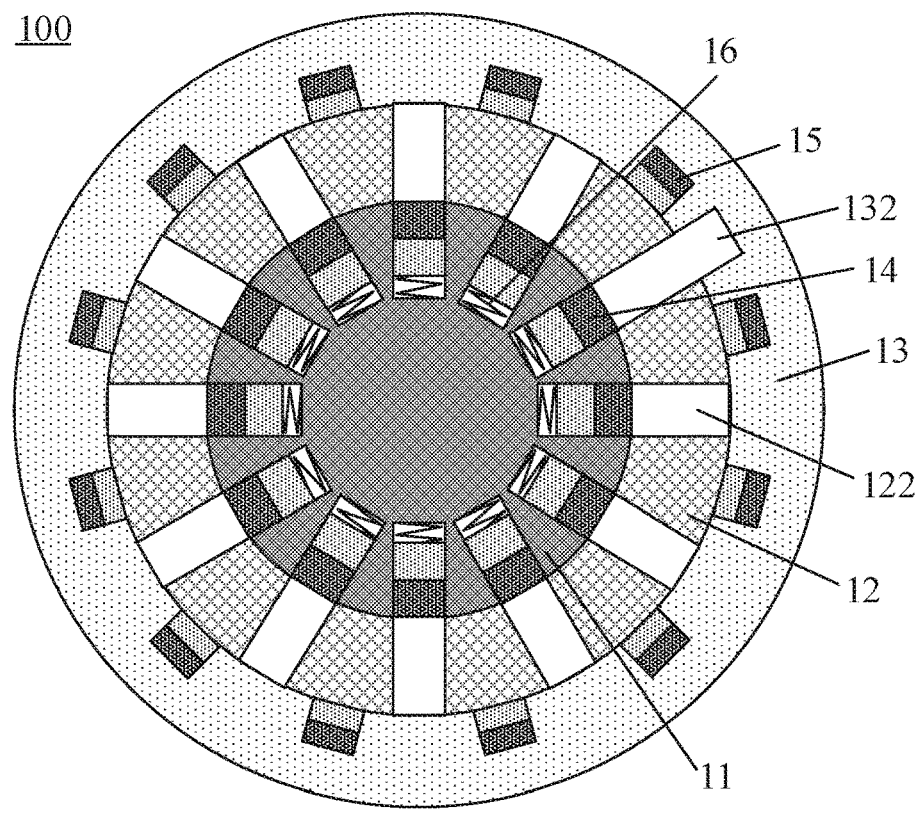
FIG. 8 is a diagram showing a state of a first magnetic member of yet another hinge at a second position, in accordance with some embodiments of the present disclosure.

For example, referring to FIGS. 7 and 8, the magnetic pole of the end of the first magnetic member 14 closest to the outer shaft sleeve 13 is opposite to the magnetic pole of the end of the second magnetic member 15 closest to the inner shaft sleeve 12.

The elastic member 16 is configured such that, in the case where the first magnetic member 14 does not face the second magnetic member 15, the first magnetic member 14 is located at the second position; and, in a case where the first magnetic member 14 faces the positioning hole 122 and the second magnetic member 15, the restoring force generated by the elastic member 16 (a direction of the restoring force is directed from the second sub-magnetic member 152 to the first magnetic member 14) is overcome by the magnetic force (i.e., gravitation) between the first magnetic member 14 and the second magnetic member 15, so that the first magnetic member 14 slides to the first position.

Herein, the process in which the first magnetic member 14 is caused to slide to the first position or the second position through the cooperation among the second magnetic member 15, the first magnetic member 14 and the elastic member 16 is as follows.

During rotation of the inner shaft sleeve 12 relative to the rotating shaft 11, the first magnetic member 14 in the receiving hole 112 in the rotating shaft 11 faces the positioning hole 122 in the inner shaft sleeve 12, and does not face the second magnetic member 15, In this case, the elastic member 16 is not elastically deformed, and the first magnetic member 14 is located at the second position under the support of the elastic member 16.

The outer shaft sleeve 13 rotates to a certain position, for example, a position at which the second magnetic member 15 faces the positioning hole 122. The gravitation generated between the second magnetic member 15 and the first magnetic member 14 is able to make the first magnetic member 14 slide to the first position, and the gravitation may overcome the restoring force generated by the elastic deformation (elongation) of the elastic member 16, and keep the first magnetic member 14 at the first position. In this case, the inner shaft sleeve 12 and the rotating shaft 11 are retained by the first magnetic member 14, so that the two cannot rotate relatively. In this way, the folding mechanism having the hinge 100 may maintain the angle corresponding to the fully folded state of the folding mechanism, or the angle corresponding to the fully unfolded state of the folding mechanism, or a certain angle between the angle corresponding to the fully folded state of the folding mechanism and the angle corresponding to the fully unfolded state of the folding mechanism.

Then, the outer shaft sleeve 13 rotates to another position, for example, a position at which the second magnetic member 15 deviates from the positioning hole 122. In this case, the gravitation to which the first magnetic member 14 is subjected is small. In a case where the restoring force generated by the elastic member 16 is greater than the gravitation, the first magnetic member 14 is able to slide to the second position in a direction away from the outer shaft sleeve 13 under the action of the restoring force generated by the elastic member 16. In this case, a relative rotation may occur between the inner shaft sleeve 12 and the rotating shaft 11, so that the angle of the folding mechanism having the hinge 100 may be changed.

Figure 9:
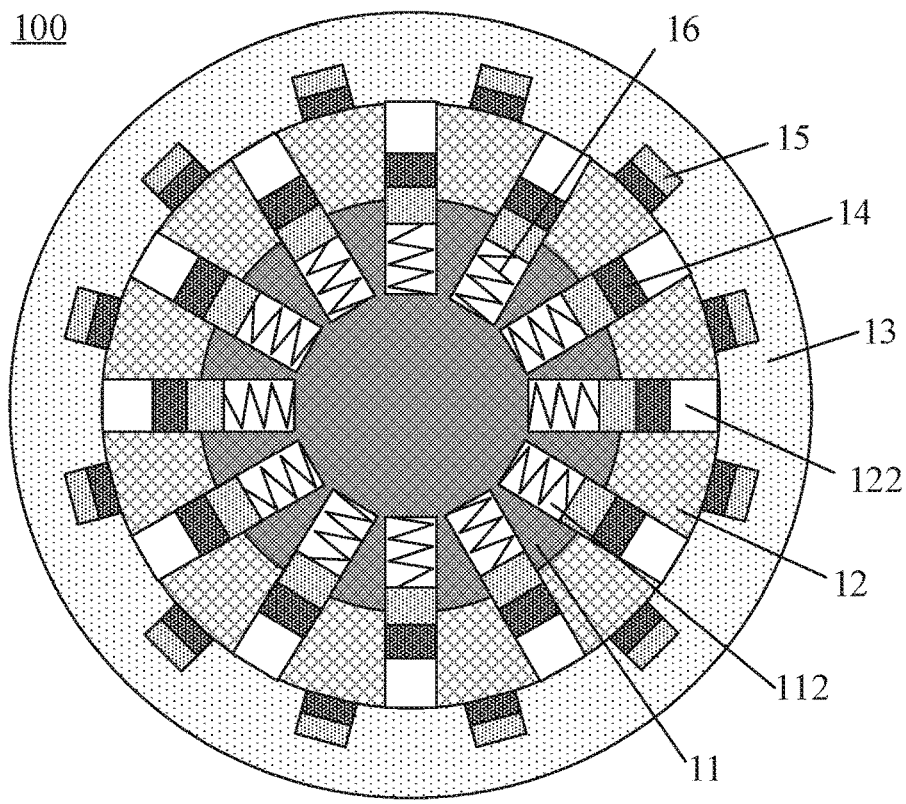
FIG. 9 is a diagram showing a state of a first magnetic member of yet another hinge at a first position, in accordance with some embodiments of the present disclosure.
Figure 10:
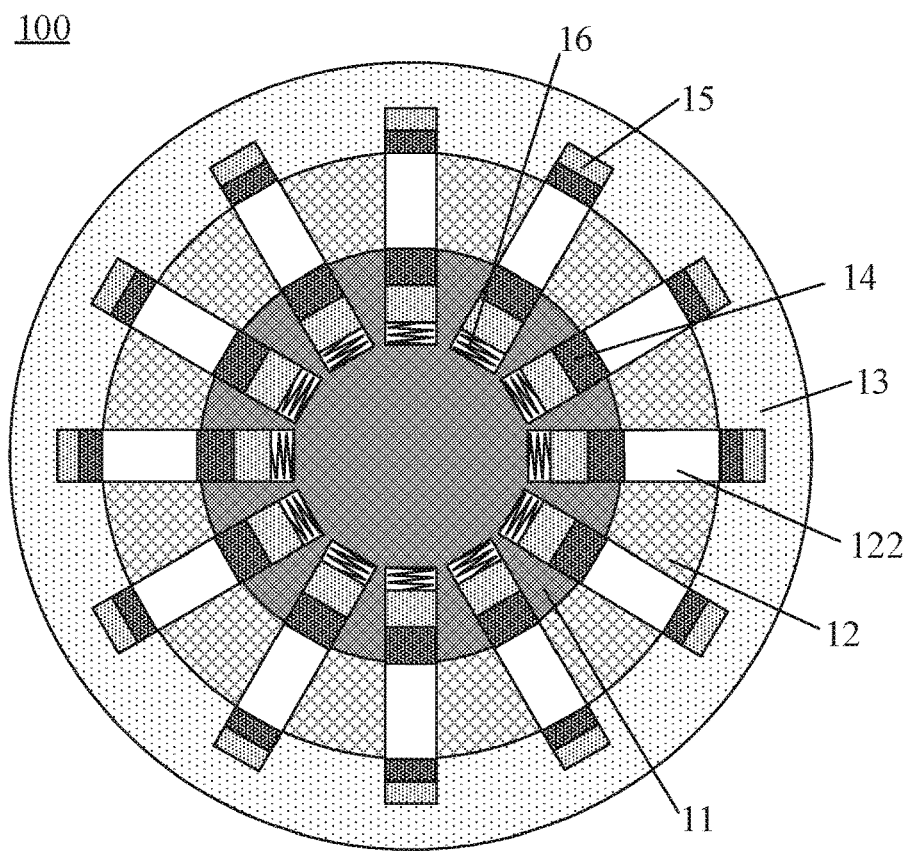
FIG. 10 is a diagram showing a state of a first magnetic member of yet another hinge at a second position, in accordance with some embodiments of the present disclosure.

For example, referring to FIGS. 9 and 10, the magnetic pole of the end of the first magnetic member 14 closest to the outer shaft sleeve 13 is the same as the magnetic pole of the end of the second magnetic member 15 closest to the inner shaft sleeve 12.

The elastic member 16 is configured such that, in the case where the first magnetic member 14 does not face the second magnetic member 15, the first magnetic member 14 is located at the first position; and, in the case where the first magnetic member 14 faces the positioning hole 122 and the second magnetic member 15, the restoring force generated by the elastic member 16 (a direction of the restoring force is directed from the first magnetic member 14 to the second magnetic member 15) is overcome by the magnetic force (i.e., repulsion) between the first magnetic member 14 and the second magnetic member 15, so that the first magnetic member 14 is able to slide to the second position.

Herein, the process in which the first magnetic member 14 is caused to slide to the first position or the second position through the cooperation among the magnetic member 15, the first magnetic member 14 and the elastic member 16 is as follows.

During the rotation of the inner shaft sleeve 12 relative to the rotating shaft 11, the first magnetic member 14 in the receiving hole 112 in the rotating shaft 11 faces the positioning hole 122 in the inner shaft sleeve 12, and does not face the second magnetic member 15. In this case, the elastic member 16 is not elastically deformed, and the first magnetic member 14 is located at the first position under the support of the elastic member 16.

The outer shaft sleeve 13 rotates to a certain position, for example, a position at which the second magnetic member 15 faces the positioning hole 122. The repulsion generated between the second magnetic member 15 and the first magnetic member 14 is able to make the first magnetic member 14 slide to the second position, and the repulsion may overcome the restoring force generated by the elastic deformation (compression) of the elastic member 16 and keep the first magnetic member 14 at the second position. In this case, a relative rotation may occur between the inner shaft sleeve 12 and the rotating shaft 11, so that the angle of the folding mechanism having the hinge 100 may be changed.

The outer shaft sleeve 13 rotates to another position, for example, a position at which the second magnetic member 15 deviates from the positioning hole 122. In this case, the repulsion to which the first magnetic member 14 is subjected is small. In a case where the restoring force generated by the elastic member 16 is greater than the repulsion, the first magnetic member 14 is able to slide to the first position in a direction toward the outer shaft sleeve 13 under the action of the restoring force generated by the elastic member 16. In this case, the inner shaft sleeve 12 and the rotating shaft 11 are retained by the first magnetic member 14, so that the two cannot rotate relatively. In this way, the folding mechanism having the hinge 100 may maintain the angle corresponding to the fully folded state of the folding mechanism, or the angle corresponding to the fully unfolded state of the folding mechanism, or a certain angle between the angle corresponding to the fully folded state of the folding mechanism and the angle corresponding to the fully unfolded state of the folding mechanism.

In some embodiments, referring to FIGS. 11 to 14, the hinge 100 provided by some embodiments of the present disclosure further includes a first position-limiting portion 17 and a second position-limiting portion 18. The first position-limiting portion 17 is connected to an end of the inner shaft sleeve 12 and is abutted against an end face of the rotating shaft 11. The second position-limiting portion 18 is connected to an end of the inner shaft sleeve 12, and is abutted against an end face of the outer shaft sleeve 13.

In some examples, referring to FIG. 11, the first position-limiting portion 17 being connected to an end of the inner shaft sleeve 12 means that the first position-limiting portion 17 is connected to the inner sidewall 121 of the inner shaft sleeve 12. The second position-limiting portion 18 being connected to an end of the inner shaft sleeve 12 means that the second position-limiting portion 18 is connected to the outer sidewall 123 of the inner shaft sleeve 12.

For example, the first position-limiting portion 17, the second position-limiting portion 18 and the inner shaft sleeve 12 are of an integrated structure.

Figure 14:
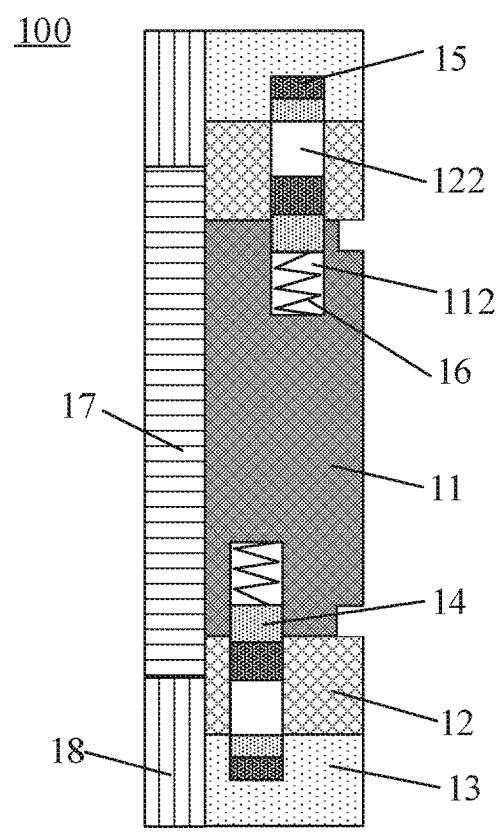
FIG. 14 is a structural diagram of another hinge, in accordance with some embodiments of the present disclosure.

In some other examples, referring to FIG. 14, the first position-limiting portion 17 being connected to an end of the inner shaft sleeve 12 means that the first position-limiting portion 17 is connected to an end face of the inner shaft sleeve 12. The second position-limiting portion 18 being connected to an end of the inner shaft sleeve 12 means that the second position-limiting portion 18 is connected to the end face of the inner shaft sleeve 12 to which the first position-limiting portion 17 is connected.

For example, referring to FIG. 11, the first position-limiting portion 17, the second position-limiting portion 18 and the inner shaft sleeve 12 are of an integrated structure. For example, referring to FIG. 14, the first position-limiting portion 17 and the second position-limiting portion 18 are of an integrated structure.

Figure 12:
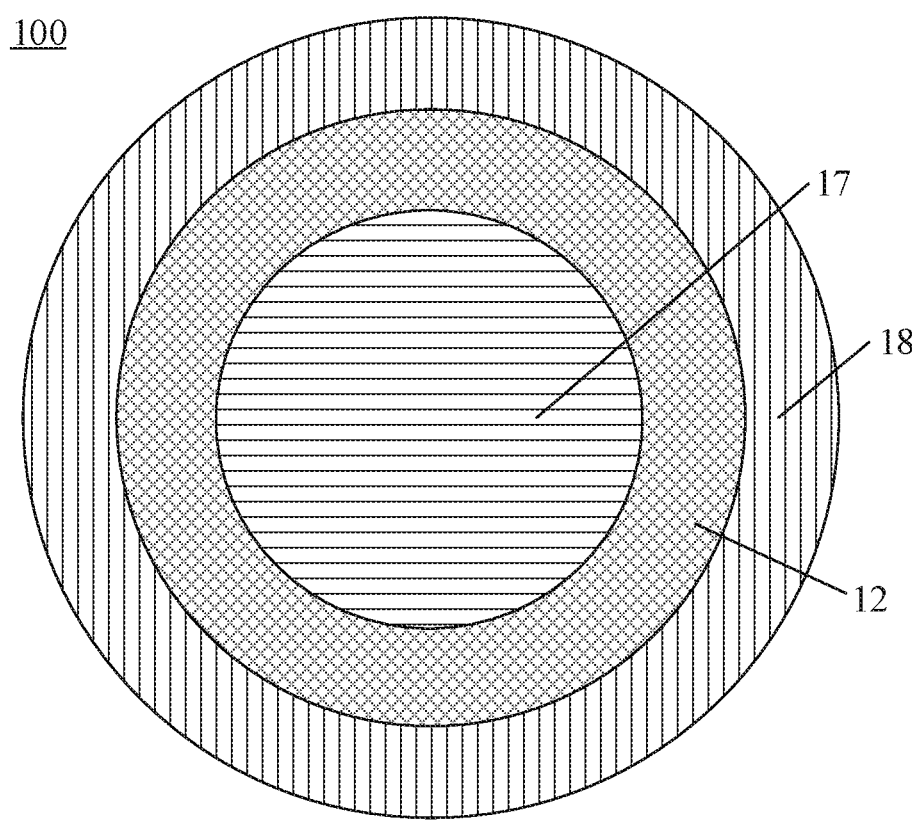
FIG. 12 is a left view of the hinge shown in FIG. 11.
Figure 13:
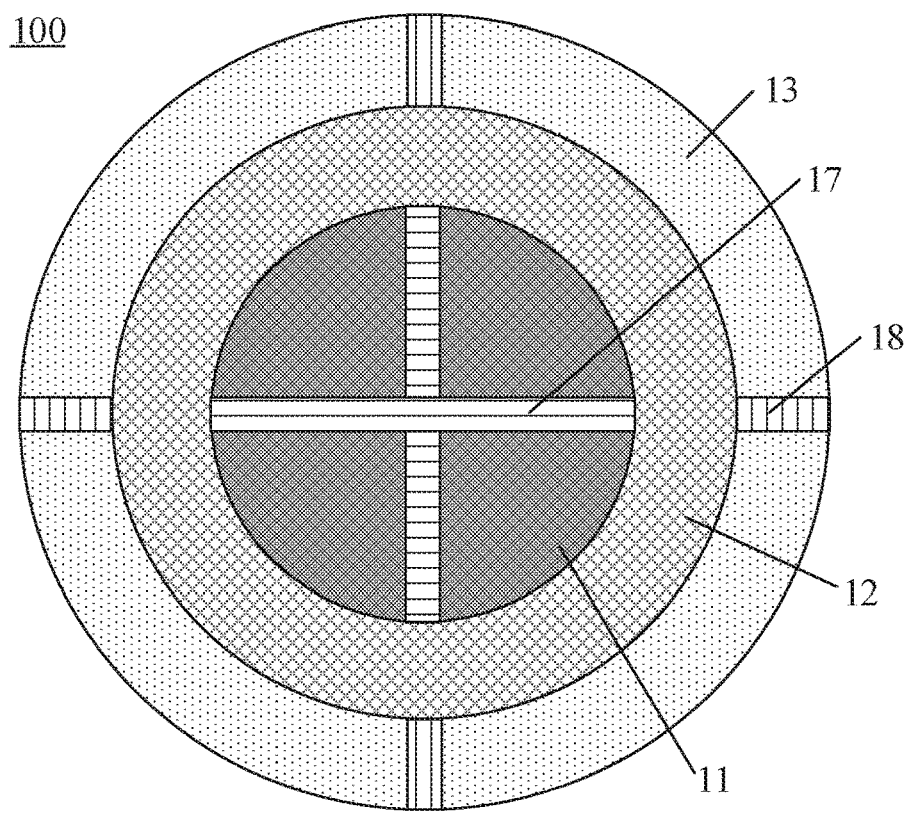
FIG. 13 is another left view of the hinge shown in FIG. 11.

Herein, the first position-limiting portion 17 has various structures. For example, as shown in FIG. 12, the first position-limiting portion 17 is a barrier plate. A shape of the baffle is, for example, circular. The first position-limiting portion 17 blocks an opening at an end of the inner shaft sleeve 12. For example, as shown in FIG. 13, the first position-limiting portion 17 is a barrier bar. A shape of the barrier bar is, for example, a strip shape or a rod shape. The number of the barrier bars is at least one, for example, one, two or three. An arrangement manner of the barrier bar may be selected according to actual needs.

The second position-limiting portion 18 has various structures. For example, as shown in FIG. 12, the second position-limiting portion 18 is a flange. A shape of the flange is, for example, annular. The flange protrudes relative to the outer sidewall 123 of the inner shaft sleeve 12 and extends away from the rotating shaft 11 in the radial direction of the rotating shaft 11. For example, as shown in FIG. 13, the second position-limiting portion 18 is a barrier bar. The shape of the barrier bar is, for example, a strip shape or a rod shape. The barrier bar extends away from the rotating shaft 11 in the radial direction of the rotating shaft 11. The number of the barrier bars is at least one, for example, one, two or three. An arrangement manner of the barrier bar may be selected according to actual needs.

By arranging the first position-limiting portion 17 and the second position-limiting portion 18, positions of the rotating shaft 11 and the outer shaft sleeve 13 may be limited in a direction parallel to the axis of the rotating shaft 11. In this way, it is possible to avoid movement of the outer shaft sleeve 13 and the rotating shaft 11 toward the first position-limiting portion 17 and the second position-limiting portion 18. Therefore, the rotating shaft 11 and the outer shaft sleeve 13 are prevented from falling off the hinge 100.

Figure 15:
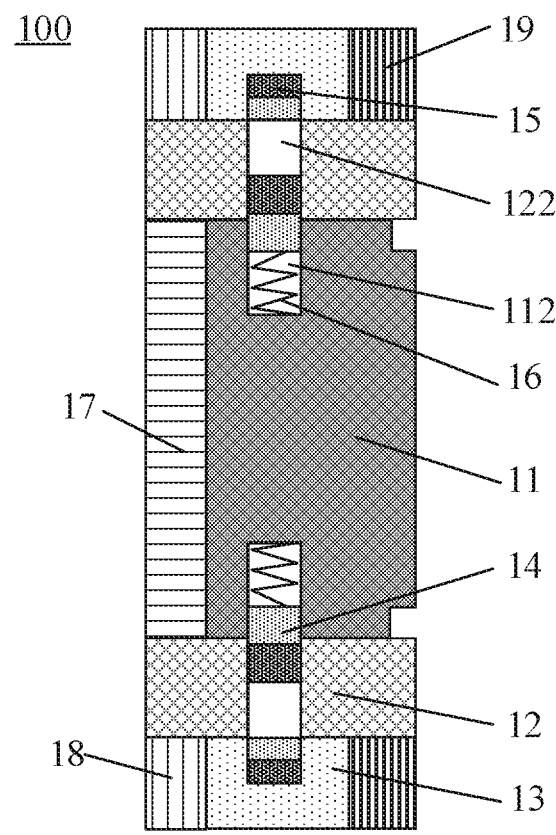
FIG. 15 is a structural diagram of yet another hinge, in accordance with some embodiments of the present disclosure.

In some embodiments, referring to FIG. 15, the hinge 100 further includes a positioning sleeve 19. The positioning sleeve 19 is sleeved on the outer sidewall 123 of the inner shaft sleeve 12, which makes the outer shaft sleeve 13 locate between the second position-limiting portion 18 and the positioning sleeve 19 in the axial direction of the rotating shaft 11. Therefore, one end face of the outer shaft sleeve 13 abuts against the second position-limiting portion 18, and another end face abuts against the positioning sleeve 19. In this way, the position of the outer shaft sleeve 13 in the axial direction of the rotating shaft 11 may be fixed, and the outer shaft sleeve 13 may be prevented from falling off from a side where the second position-limiting portion 18 is provided and from a side where the positioning sleeve 19 is provided.

In the process of assembling the hinge 100 including the positioning sleeve 19, the outer shaft sleeve 13 may be first sleeved on the outer sidewall 123 of the inner shaft sleeve 12, and then the positioning sleeve 19 is sleeved on the outer sidewall 123 of the inner shaft sleeve 12. This makes the positioning sleeve 19 abut against the outer shaft sleeve 13 so as to realize the positioning of the outer shaft sleeve 13 in the axial direction of the rotating shaft 11.

Figure 16:
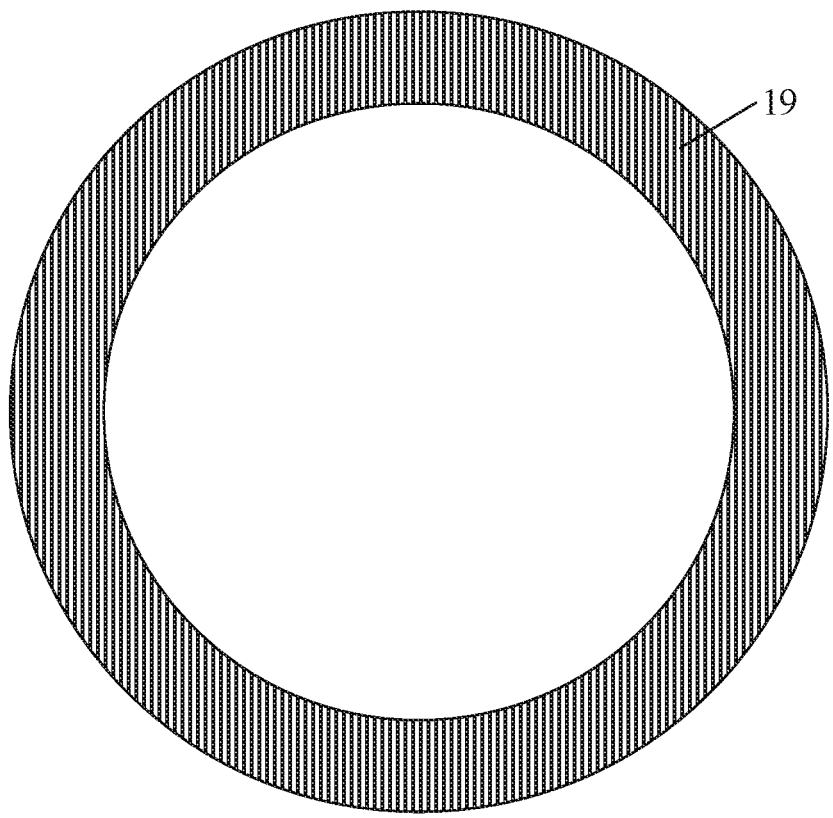
FIG. 16 is a structural diagram of a positioning sleeve, in accordance with some embodiments of the present disclosure.
Figure 17:
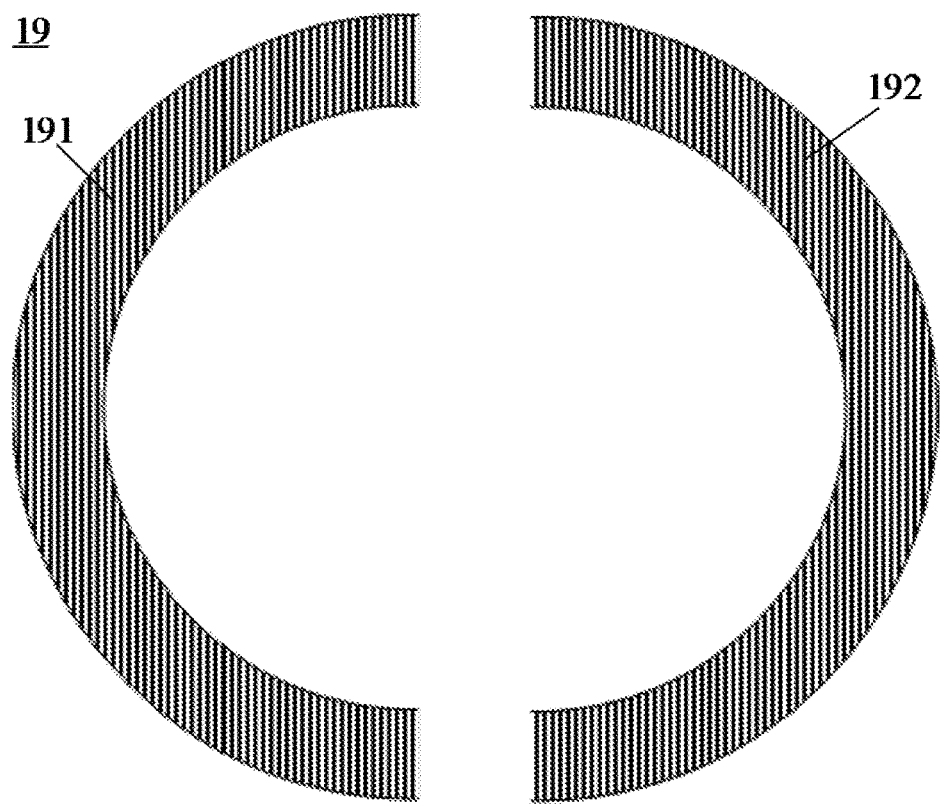
FIG. 17 is a structural diagram of another positioning sleeve, in accordance with some embodiments of the present disclosure.

In addition, the manner in which the positioning sleeve 19 is sleeved on the outer sidewall 123 of the inner shaft sleeve 12 is not unique. For example, a shape of the positioning sleeve 19 is annular (as shown in FIG. 16). The outer sidewall 123 of the inner shaft sleeve 12 is provided with external threads, the inner sidewall of the positioning sleeve 19 is provided with internal threads, and the positioning sleeve 19 and the inner shaft sleeve 12 are connected through threads. For another example, as shown in FIG. 17, the positioning sleeve 19 includes a first half positioning sleeve 191 and a second half positioning sleeve 192. Shapes of end faces of the first half positioning sleeve 191 and the second half positioning sleeve 192 are both semi-annular. The first half positioning sleeve 191 and the second half positioning sleeve 192 may be paired with each other. The first half positioning sleeve 191 and the second half positioning sleeve 192 are both provided with positioning pins on their inner sidewalls, and the outer sidewall 123 of the inner shaft sleeve 12 is provided with a positioning groove corresponding to a position of each positioning pin. Each positioning pin is inserted into the corresponding positioning groove, and each positioning pin is in interference fit with the corresponding positioning groove. After the first half positioning sleeve 191 and the second half positioning sleeve 192 are paired with each other, the first half positioning sleeve 191 and the second positioning positioning sleeve 192 may be sleeved on the inner shaft sleeve 12.

Figure 18:
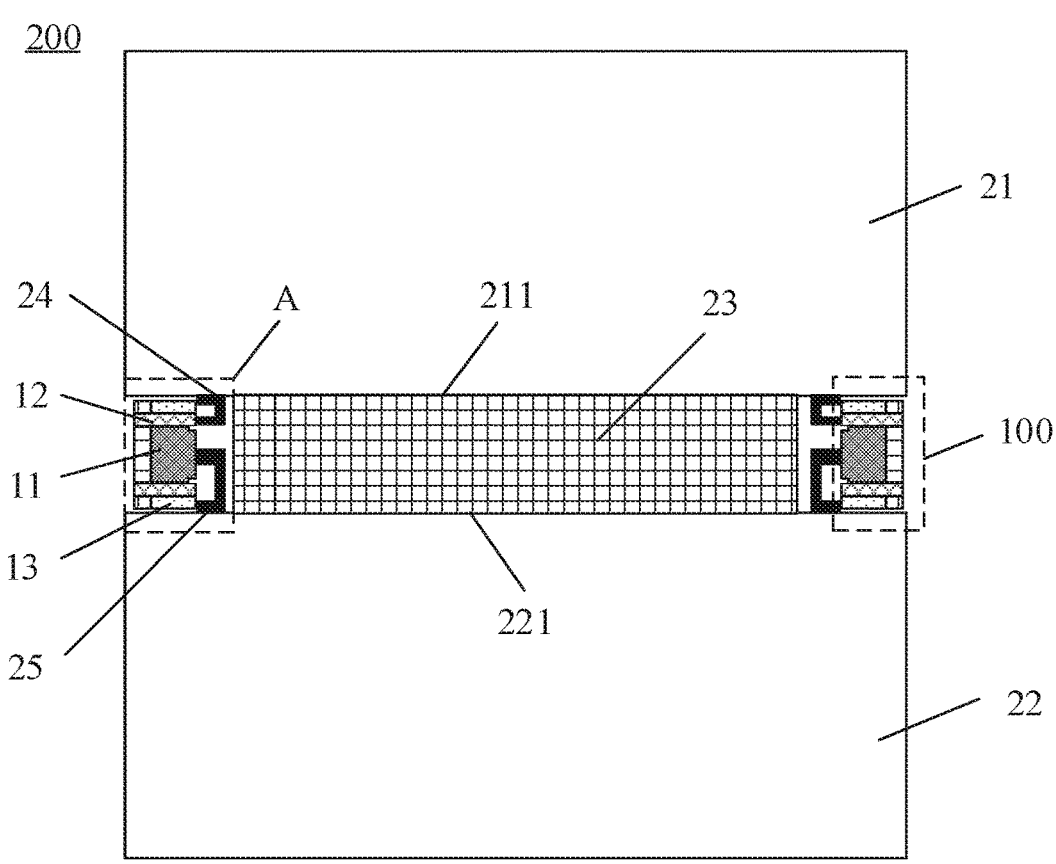
FIG. 18 is a structural diagram of a folding mechanism, in accordance with some embodiments of the present disclosure.
Figure 19:
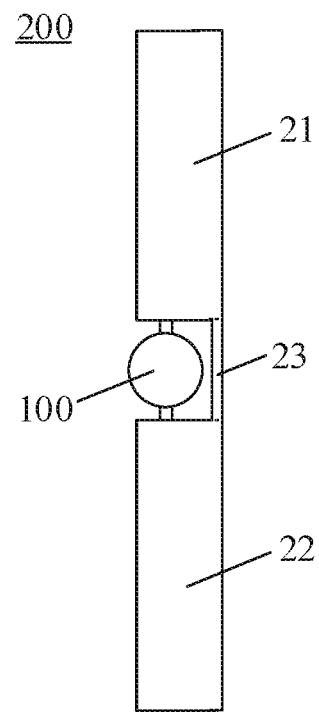
FIG. 19 is a structural diagram of another folding mechanism, in accordance with some embodiments of the present disclosure.

Some embodiments of the present disclosure provide a folding mechanism 200. Referring to FIGS. 18 and 19, the folding mechanism 200 includes a first carrier 21, a second carrier 22, and at least one hinge 100 as provided in some embodiments described above. The inner shaft sleeve 21 of one hinge 100 of the at least one hinge 100 is fixedly connected to the first carrier 21, and the rotating shaft 11 of the hinge 100 is fixedly connected to the second carrier 22, so that the first carrier 21 can rotate relative to the second carrier 22 around the rotating shaft 11 of the hinge 100.

In a case where the folding mechanism 200 is applied to a terminal device, at least one of the first carrier 21 and the second carrier 22 is configured to carry a display screen. For example, both the first carrier 21 and the second carrier 22 carry the display screens; or, one of the first carrier 21 and the second carrier 22 carries the display screen, and another carries a human-computer interaction device. For example, the human-computer interaction device is a keyboard, a touch screen, etc.

The first carrier 21 and the second carrier 22 have a certain strength, so as to ensure the stability of the structure of the device (the display screen and/or the human-computer interaction device) carried by the first carrier 21 and the second carrier 22.

Shapes of the first carrier 21 and the second carrier 22 may be selected according to actual needs, which is not limited in the embodiments of the present disclosure. For example, shape(s) of at least one of the first carrier 21 and the second carrier 22 is rectangular as shown in FIG. 18; or, the shape(s) of at least one of the first carrier 21 and the second carrier 22 is in a special shape, for example, a round shape, or a shape where corners thereof are round corners.

The folding or unfolding process of the folding mechanism 200 will be schematically described below.

The folding or unfolding process of the folding mechanism 200 is a process in which the first carrier 21 and the second carrier 22 rotate relatively. The process in which the first carrier 21 and the second carrier 22 rotate relatively is a process in which the inner shaft sleeve 12 and the rotating shaft 11 rotate relatively.

For example, the hinge 100 provided in some embodiments of the present disclosure adopts the structure shown in FIGS. 1 and 2. In a case where the first magnetic member 14 in the receiving hole 112 in the rotating shaft 11 faces the positioning hole 122 in the inner shaft sleeve 12, the outer shaft sleeve 13 rotates (the rotation of the outer shaft sleeve 13 may be performed by the user), so that the position of the second magnetic member 15 in the placement hole 132 in the outer shaft sleeve 13 is changed relative to the first magnetic member 14. As shown in FIG. 1, the outer shaft sleeve 13 is rotated to a certain position, for example, a position at which the second sub-magnetic member 152 faces the positioning hole 122. Gravitation is generated between the first magnetic member 14 and the second sub-magnetic member 152, and the first magnetic member 14 slides to the first position under the action of the gravitation. In this case, the inner shaft sleeve 12 and the rotating shaft 11 are retained by the first magnetic member 14, and the two cannot rotate relative to each other. In this way, the first carrier 21 and the second carrier 22 may be maintained at the angle corresponding to the fully folded state of the folding mechanism, or the angle corresponding to the fully unfolded state of the folding mechanism, or a certain angle between the angle corresponding to the fully folded state of the folding mechanism and the angle corresponding to the fully unfolded state of the folding mechanism. As shown in FIG. 2, the outer shaft sleeve 13 rotates to another position, for example, a position at which the first sub-magnetic member 151 faces the positioning hole 122. Repulsion is generated between the first magnetic member 14 and the first sub-magnetic member 151, and the first magnetic member 14 slides to the second position under the action of the repulsion. In this case, a relative rotation may occur between the inner shaft sleeve 12 and the rotating shaft 11, and the first carrier 21 may rotate freely relative to the second carrier 22, and thus an included angle between the first carrier 21 and the second carrier 22 may be changed.

Therefore, in the folding mechanism 200 provided by some embodiments of the present disclosure, the first carrier 21 is connected to the inner shaft sleeve 12 of the hinge 100, and the second carrier 22 is connected to the rotating shaft 11 of the hinge 100. In this way, the positioning between the inner sleeve 12 and the rotating shaft 11 in the hinge 100 may be used to realize the fixation of the first carrier 21 and the second carrier 22 at a certain angle between an angle at which they are fully unfolded and an angle at which they are fully folded. Moreover, by adjusting the relative position between the first magnetic member 14 and different positioning holes 122 in the hinge 100, a fixed angle between the angle at which the first carrier 21 and the second carrier 22 in the folding mechanism 200 are fully unfolded and the angle at which the first carrier 21 and the second carrier 22 in the folding mechanism 200 are fully folded may be adjusted. In this way, the user's need to adjust the watching angle of the screen of the foldable terminal device may be met.

In addition, the structure of the hinge 100 in the folding mechanism 200 is relatively simple. In a case where a certain component needs to be replaced, the inner shaft sleeve 12 is removed from the first carrier 21, and then the rotating shaft 11 is removed from the second carrier 21. In this way, it is possible to disassemble the rotating shaft 11, the inner shaft sleeve 12, and the outer shaft sleeve 13, and a certain component in the hinge 100 may be replaced.

In some embodiments, referring to FIG. 18, the folding mechanism 200 further includes a first connecting arm 24 connected to the first carrier 21 and the inner shaft sleeve 12, and a second connecting arm 25 connected to the second carrier 22 and the rotating shaft 11.

With continued reference to FIG. 18, after the hinge 100 is assembled with the first carrier 21 and the second carrier 22, at least one of the first connecting arm 24 and the second connecting arm 25 abuts against an end face of the outer shaft sleeve 13, which may limit the movement of the outer shaft sleeve 13 in the axial direction of the rotating shaft 11 toward the first connecting arm 24 and the second connecting arm 25.

In addition, in a case where the hinge 100 includes the first position-limiting portion 17 and the second position-limiting portion 18, one end face of the rotating shaft 11 abuts against the first position-limiting portion 17, and another end face thereof is connected to the second connecting arm 25. In this way, the rotation shaft 11 is limited in the axial direction of the rotating shaft 11, so as to realize the fixation of the rotating shaft 11 in the axial direction. One end face of the outer shaft sleeve 13 abuts against the second position-limiting portion 18, and another end face thereof abuts against at least one of the first connecting arm 24 and the second connecting arm 25. In this way, the outer shaft sleeve 13 may be limited in the axial direction of the outer shaft sleeve 13, so as to realize the fixation of the outer shaft sleeve 13 in the axial direction of the outer shaft sleeve 13.

In the folding mechanism 200 provided in some embodiments of the present disclosure, the number of the hinges 100 is selected according to actual needs.

In some examples, the number of the hinges 100 is one. The hinge 100 is installed at one side (e.g., the left side or the right shown in FIG. 18) of two opposite sides of one end of the first carrier 21, or installed at the middle of one end of the first carrier 21. Herein, one end of the first carrier 21 refers to an end of the first carrier 21 proximate to the second carrier 22 in a case where the folding mechanism 200 is fully unfolded.

In some other examples, referring to FIG. 18, the number of the hinges 100 is two. The two hinges 100 are disposed at two opposite sides of one end of the first carrier 21. In the two hinges 100, the inner shaft sleeve 21 of each hinge 100 is fixedly connected to the first carrier 21, and the rotating shaft 11 of each hinge 100 is fixedly connected to the second carrier 22.

By arranging two hinges 100, and arranging the two hinges 100 at the two opposite sides of one end of the first carrier 21, that is, at two opposite sides of one end of the second carrier 22, force applied to each hinge 100 may be more uniform during the relative rotation of the first carrier 21 and the second carrier 22. Therefore, the relative rotation of the first carrier 21 and the second carrier 22 is stable.

There are various arrangement manners of the two hinges 100. The embodiments of the present disclosure do not limited thereto, and the arrangement manners of the two hinges 100 may be selected according to actual needs. For example, the two hinges 100 have a same structure; or the two hinges 100 have different structures. For example, one of the hinges 100 has a structure as shown in FIGS. 3 and 4, and the other hinge 100 has a structure as shown in FIGS. 7 and 8.

In some embodiments, the folding mechanism 200 further includes a flexible carrying portion 23. The flexible carrying portion 23 is connected to a first end 211 of the first carrier 21 and to a first end 221 of the second carrier 22. The flexible carrying portion 23 is provided with avoidance opening(s) A in region(s) corresponding to the hinge(s) 100.

The first end 211 of the first carrier 21 is an end of the first carrier 21 connected to the hinge 100 in a direction perpendicular to the axial direction of the rotating shaft 11. The first end 221 of the second carrier 22 is an end of the second carrier 22 connected to the hinge 100 in the direction perpendicular to the axial direction of the rotating shaft 11.

In a case where an entire flexible display screen is provided on the first carrier 21 and the second carrier 22, a bending portion of the flexible display screen may protrude from a gap between the first carrier 21 and the second carrier 22 after the first carrier 21 and the second carrier 22 are folded. By arranging the flexible carrying portion 23 between the first end 211 of the first carrier 21 and the first end 221 of the second carrier 22, the flexible carrying portion 23 may be used to support and protect the bending portion of the flexible display screen. Therefore, the bending portion of the flexible display screen may be prevented from being damaged.

By providing the avoidance opening(s) A in the flexible carrying portion 23, the hinge(s) 100 in the folding mechanism 200 may be bypassed, so that movement interference between the flexible carrying portion 23 and the hinge(s) 100 may be avoided.

Herein, the flexible carrying portion 23 is made of a material with relatively low hardness, for example, silica gel.

In some embodiments of the present disclosure, the number of the first carriers 21 is one (as shown in FIGS. 18 and 19), or the number of the first carriers 21 is two.

In a case where the number of the first carriers 21 is two, the two first carriers 21 are located at two opposite sides of the second carrier 22, and the two first carriers 21 are hinged with the second carrier 22 through at least one hinge 100. In this way, after the folding mechanism 200 is folded, an area of the folding mechanism 200 in a folded state may be further reduced.

In addition, the number of the first carriers 21 and the number of the second carriers 22 may be two or more than two, which is not specifically limited herein. Ever two adjacent carriers are hinged through at least one hinge 100.

Figure 20:
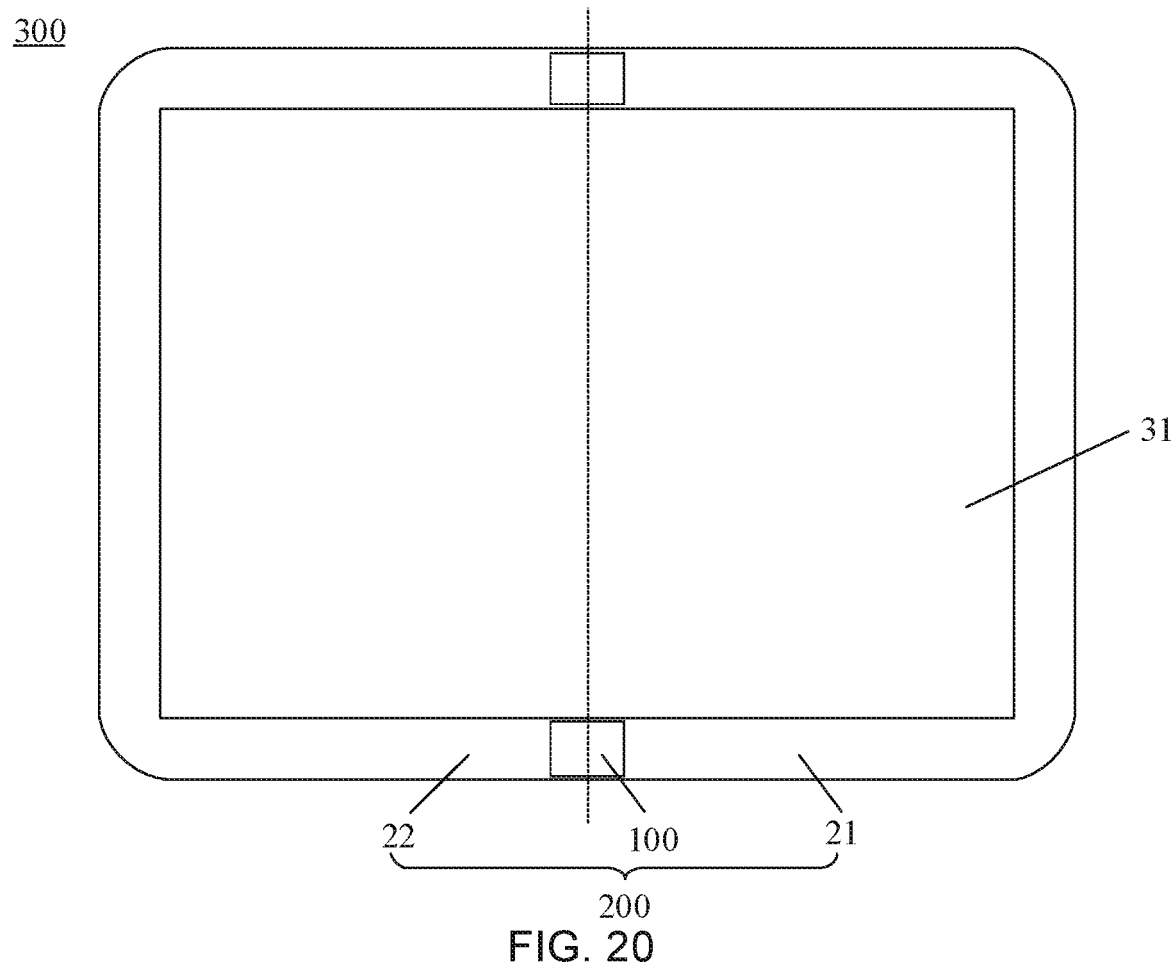
FIG. 20 is a structural diagram of a terminal device, in accordance with some embodiments of the present disclosure.

Some embodiments of the present disclosure provide a terminal device 300. Referring to FIG. 20, the terminal device 300 includes the folding mechanism 200 as provided in the embodiments described above. For example, the folding mechanism 200 includes two hinges 100, and the two hinges 100 are disposed at both sides of the terminal device 300 along a center line. The dashed line in FIG. 20 represents the center line of the terminal device 300. The dashed line is only for illustrating the arranging positions of the two hinges 100, and is not present in the terminal device.

The folding mechanism 200 in the terminal device 300 has the same technical effect as the folding mechanism 200 in the embodiments described above, which will not be repeated here.

In some embodiments, referring to FIG. 20, the terminal device 300 further includes display screen(s) 31, and the display screen(s) 31 are disposed on the folding mechanism 200.

Herein, the display screen(s) 31 are arranged on the folding mechanism 200 in various manners.

In some examples, the display screen 31 is a flexible display screen. The flexible display screen is disposed on the first carrier 21 and the second carrier 22 of the folding mechanism 200, and the flexible display screen may be folded through the relative rotation between the first carrier 21 and the second carrier 22.

Herein, that the flexible display screen is disposed on the first carrier 21 and the second carrier 22 of the folding mechanism 200, for example, is that in a state in which the folding mechanism 200 is unfolded, the flexible display screen is located at the same side of the first carrier 21 and the second carrier 22.

The terminal device 300 adopting the above arrangement manner is, for example, a foldable mobile phone (e.g., a full screen mobile phone, a waterdrop-shaped notch screen mobile phone or a notch screen mobile phone) or a tablet computer.

In some other examples, the number of the display screen 31 is at least one, and the at least one display screen 31 is disposed on at least one of the first carrier 21 and the second carrier 22. Herein, the display screen 31 is, for example, a flexible display screen or a non-flexible display screen. For example, the number of the display screen 31 is one, and the display screen 31 is disposed on the first carrier 21 or the second carrier 22; or, the number of the display screen 31 is two, and one of the two display screens 31 is disposed on the first carrier 21, and the other is disposed on the second carrier 22.

The terminal device 300 adopting the above arrangement manner is, for example, a notebook computer or a clamshell phone.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A hinge, comprising:
   a rotating shaft, wherein at least one receiving hole is provided in a side face of the rotating shaft parallel to an axis of the rotating shaft;
   an inner shaft sleeve rotatably sleeved on an outer side of the rotating shaft, wherein a plurality of positioning holes are provided in an inner sidewall of the inner shaft sleeve, and the plurality of positioning holes are distributed and spaced apart from each other in a circumferential direction of the inner shaft sleeve;
   an outer shaft sleeve rotatably sleeved on an outer side of the inner shaft sleeve, wherein at least one placement hole is provided in an inner sidewall of the outer shaft sleeve, and the at least one placement hole is distributed and spaced apart from each other in a circumferential direction of the outer shaft sleeve;
   at least one first magnetic member, wherein each first magnetic member of the at least one first magnetic member is slidably disposed in one receiving hole of the at least one receiving hole;
   at least one second magnetic member, wherein each second magnetic member of the at least one second magnetic member is disposed in one placement hole of the at least one placement hole; wherein
   the outer shaft sleeve is configured to rotate relative to the inner shaft sleeve, and in a case where the first magnetic member faces a positioning hole, the first magnetic member faces the second magnetic member;
   the first magnetic member is configured to, in a case where the first magnetic member faces the positioning hole and the second magnetic member, slide to a first position or a second position under action of magnetic force between the first magnetic member and the second magnetic member; and wherein
   the first position is a position at which a part of the first magnetic member is located in the receiving hole and another part of the first magnetic member is located in the positioning hole; and the second position is a position at which the first magnetic member is located in the receiving hole.

2. The hinge according to claim 1, further comprising: at least one elastic member, each elastic member being disposed in one receiving hole; wherein
   each elastic member is connected to the first magnetic member; and
   the elastic member is configured such that, in a case where the first magnetic member does not face the second magnetic member, the first magnetic member is located at the first position or the second position.

3. The hinge according to claim 1, wherein the at least one second magnetic member includes a plurality of second magnetic members, and each second magnetic member includes a first sub-magnetic member and a second sub-magnetic member;
   in a radial direction of the rotating shaft, magnetic poles of ends of a plurality of first sub-magnetic members closest to the inner shaft sleeve are the same as a magnetic pole of an end of the first magnetic member closest to the outer shaft sleeve, and magnetic poles of ends of a plurality of second sub-magnetic members closest to the inner shaft sleeve are opposite to a magnetic pole of an end of the first magnetic member closest to the outer shaft sleeve; and
   in a case where the first magnetic member faces the positioning hole, the outer shaft sleeve rotates relative to the inner shaft sleeve, and one first sub-magnetic member of the plurality of first sub-magnetic members faces the first magnetic member, and the first magnetic member is capable of sliding to the second position; or, one second sub-magnetic member of the plurality of second sub-magnetic members faces the first magnetic member, and the first magnetic member is capable of sliding to the first position.

4. The hinge according to claim 3, wherein the hinge further comprises at least one elastic member,
   each elastic member is configured such that, in a case where the first magnetic member does not face the first sub-magnetic member and the second sub-magnetic member, the first magnetic member is located at the first position; and
   in a case where the first magnetic member faces the positioning hole and the first sub-magnetic member, restoring force generated by the elastic member is overcome by magnetic force between the first magnetic member and the first sub-magnetic member, and the first magnetic member is capable of sliding to the second position.

5. The hinge according to claim 3, wherein the hinge further comprises at least one elastic member,
   each elastic member is configured such that, in a case where the first magnetic member does not face the first sub-magnetic member and the second sub-magnetic member, the first magnetic member is located at the second position; and
   in a case where the first magnetic member faces the positioning hole and the second sub-magnetic member, restoring force generated by the elastic member is overcome by magnetic force between the first magnetic member and the second sub-magnetic member, and the first magnetic member is capable of sliding to the first position.

6. The hinge according to claim 3, wherein the plurality of first sub-magnetic members and the plurality of second sub-magnetic members are alternately arranged and spaced apart from each other in the circumferential direction of the outer shaft sleeve.

7. The hinge according to claim 2, wherein a magnetic pole of an end of the first magnetic member closest to the outer shaft sleeve is opposite to an magnetic pole of an end of the second magnetic member closest to the inner shaft sleeve;
   the elastic member is configured such that, in a case where the first magnetic member does not face the second magnetic member, the first magnetic member is located at the second position; and
   in a case where the first magnetic member faces the positioning hole and the second magnetic member, restoring force generated by the elastic member is overcome by magnetic force between the first magnetic member and the second magnetic member, and the first magnetic member is capable of sliding to the first position.

8. The hinge according to claim 2, wherein a magnetic pole of an end of the first magnetic member closest to the outer shaft sleeve is the same as a magnetic pole of an end of the second magnetic member closest to the inner shaft sleeve;

the elastic member is configured such that, in a case where the first magnetic member does not face the second magnetic member, the first magnetic member is located at the first position; and in a case where the first magnetic member faces the positioning hole and the second magnetic member, restoring force generated by the elastic member is overcome by magnetic force between the first magnetic member and the second magnetic member, and the first magnetic member is capable of sliding to the second position.

9. The hinge according to claim 1, further comprising:

a first position-limiting portion connected to an end of the inner shaft sleeve, and abutted against an end face of the rotating shaft; and a second position-limiting portion connected to another end of the inner shaft sleeve, and abutted against an end face of the outer shaft sleeve.

10. The hinge according to claim 1, wherein the positioning hole penetrates the inner shaft sleeve from the inner sidewall of the inner shaft sleeve to an outer sidewall of the inner shaft sleeve; or the positioning hole penetrates the inner shaft sleeve from the inner sidewall of the inner shaft sleeve to a certain position between the inner sidewall and the outer sidewall of the inner shaft sleeve.

11. The hinge according to claim 1, wherein the whole second magnetic member or a part of the second magnetic member is disposed in the placement hole.

12. The hinge according to claim 1, wherein the rotating shaft, the inner shaft sleeve and the outer shaft sleeve are all made of non-ferromagnetic materials.

13. The hinge according to claim 1, wherein the at least one receiving hole and the plurality of positioning holes are located in a same plane perpendicular to the axial direction of the rotating shaft.

14. The hinge according to claim 1, wherein the at least one placement holes and the at least one receiving hole are located in a same plane perpendicular to the axial direction of the rotating shaft.

15. The hinge according to claim 1, wherein the at least one receiving hole is evenly arranged and spaced apart from each other in a circumferential direction of the rotating shaft, the plurality of positioning holes are evenly arranged and spaced apart from each other in the circumferential direction of the inner shaft sleeve, and the at least one placement holes is evenly arranged and spaced apart from each other in the circumferential direction of the outer shaft sleeve;

a number of the at least one receiving hole, a number of the plurality of positioning holes and a number of the at least one placement holes are the same; or, a number of the at least one receiving hole and a number of the plurality of positioning holes are the same, and a number of the at least one placement hole is twice a number of the at least one receiving hole; and each receiving hole is provided with one first magnetic member; and each placement hole is provided with one second magnetic member.

16. A folding mechanism, comprising a first carrier, a second carrier and at least one hinge according to claim 1; wherein the inner shaft sleeve of one hinge of the at least one hinge is fixedly connected to the first carrier, and the rotating shaft of the hinge is fixedly connected to the second carrier, and the first carrier is capable of rotating relative to the second carrier around the rotating shaft of the hinge.

17. The folding mechanism according to claim 16, wherein the at least one hinge includes two hinges; and the two hinges are disposed at two opposite sides of an end of the first carrier.

18. The folding mechanism according to claim 16, wherein the inner shaft sleeve of the hinge is fixedly connected to a first end of the first carrier, the rotating shaft of the hinge is connected to a first end of the second carrier; and the folding mechanism further comprises: a flexible carrying portion connected to the first end of the first carrier and the first end of the second carrier; and at least one avoidance opening, wherein each avoidance opening is provided in a region corresponding to one hinge in the flexible carrying portion.

19. A terminal device, comprising the folding mechanism according to claim 16.

20. The terminal device according to claim 19, further comprising at least one display screen; wherein the at least one display screen includes one flexible display screen; the display screen is disposed on the first carrier and the second carrier of the folding mechanism, and the display screen is capable of being folded through a relative rotation between the first carrier and the second carrier; or the at least one display screen is disposed on the first carrier and/or the second carrier.

* * * * *